US010955547B2

(12) United States Patent
Ray

(10) Patent No.: US 10,955,547 B2
(45) Date of Patent: Mar. 23, 2021

(54) COMBINED RADAR AND COMMUNICATIONS SYSTEM USING COMMON SIGNAL WAVEFORM

(71) Applicant: The Boeing Company, Chicago, IL (US)

(72) Inventor: Gary A. Ray, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 453 days.

(21) Appl. No.: 15/988,112

(22) Filed: May 24, 2018

(65) Prior Publication Data
US 2019/0361113 A1   Nov. 28, 2019

(51) Int. Cl.
| G01S 13/90 | (2006.01) |
| G01S 7/00 | (2006.01) |
| G01S 7/282 | (2006.01) |
| G01S 7/285 | (2006.01) |
| G01S 13/24 | (2006.01) |
| G01S 13/58 | (2006.01) |
| H03D 3/00 | (2006.01) |

(Continued)

(52) U.S. Cl.
CPC .............. *G01S 13/90* (2013.01); *G01S 7/003* (2013.01); *G01S 7/282* (2013.01); *G01S 7/285* (2013.01); *G01S 13/24* (2013.01); *G01S 13/58* (2013.01); *H03D 3/009* (2013.01); *H04L 27/2332* (2013.01); *H04L 27/3863* (2013.01)

(58) Field of Classification Search
None
See application file for complete search history.

(56) References Cited

U.S. PATENT DOCUMENTS

| 5,426,528 A | 6/1995 | Yamamoto et al. |
| 6,191,649 B1 | 2/2001 | Sugita et al. |

(Continued)

FOREIGN PATENT DOCUMENTS

WO   2012037680 A1   3/2012

OTHER PUBLICATIONS

Extended European Search Report dated Sep. 2, 2019 in European Patent Application No. 19171492.2 (European counterpart of the instant patent application).

(Continued)

*Primary Examiner* — Whitney Moore
(74) *Attorney, Agent, or Firm* — Ostrager Chong Flaherty & Broitman P.C.

(57) ABSTRACT

A system having a set of common hardware and common signal processing together with a common waveform family that can be used to achieve both efficient radar and efficient communications functions. The system includes a common radar/communications transmitter having a transmission antenna and a combined radar and communications receiver having a common reception antenna. The common radar/communications transmitter is configured to transmit combined radar/communications waveform-modulated signals comprising symbols, each symbol consisting of an up chirp and a down chirp. The combined radar and communications receiver includes a baseband radar signal processing module configured to estimate range and range rate of a radar object from the received symbols and a baseband communications signal processing module configured to detect slopes and initial phases of the up and down chirps of each received symbol.

20 Claims, 13 Drawing Sheets

(51) Int. Cl.
*H04L 27/233* (2006.01)
*H04L 27/38* (2006.01)

(56) References Cited

U.S. PATENT DOCUMENTS

| | | |
|---|---|---|
| 6,310,513 B1 | 10/2001 | Iemura |
| 6,459,742 B1 | 10/2002 | Marque-Pucheu et al. |
| 6,965,341 B1 | 11/2005 | Cho et al. |
| 7,376,688 B1 | 5/2008 | von der Embse |
| 7,379,013 B2 | 5/2008 | Dean et al. |
| 7,978,123 B2 | 7/2011 | Lam et al. |
| 8,786,489 B2 | 7/2014 | Patrick |
| 9,325,545 B2 | 4/2016 | Ray |
| 9,778,355 B2 | 10/2017 | Li et al. |
| 2007/0096885 A1 | 5/2007 | Cheng et al. |
| 2014/0362891 A1 | 12/2014 | Hiscock |
| 2016/0047892 A1 | 2/2016 | Franceschini et al. |
| 2017/0214746 A1 | 7/2017 | Zettler et al. |
| 2017/0310758 A1 | 10/2017 | Davis et al. |

OTHER PUBLICATIONS

Rohling and Meinecke, "Waveform Design Principles for Automotive Radar Systems", in: 2001 CIE Int'l Conf. on Radar, 2001.

Rohling and Moller, "Radar Waveform for Automotive Radar Systems and Applications", in: 2008 IEEE Radar Conf., May 26-30, 2008.

Djuric and Kay, "Parameter Estimation of Chirp Signals", IEEE Trans. on Acoustics, Speech and Signal Processing, vol. 38, No. 12, Dec. 1990, pp. 2118-2126.

Wu and Linnartz, "Detection Performance Improvement of FMCW Radar Using Frequency Shift", Symposium on Information Theory and Signal Processing in the Benelux, Brussels, Belgium, May 10-11, 2011.

Peacock and Santhanam, "Multicomponent Subspace Chirp Parameter Estimation Using Discrete Fractional Fourier Analysis", Proc. of the IASTED Int'l Conf., Dec. 14-16, 2011, Dallas, USA.

Parrish, An Overview of FMCW Systems in MATLAB, EE 383V Radar Principles Term Project, Texas Instruments Inc.

Sit et al., "The OFDM Joint Radar-Communication System: An Overview", SPACOMM 2011, The Third Int'l Conf. on Adv. in Satellite and Space Communications.

COMBINED RADAR AND COMMUNICATIONS SYSTEM USING COMMON SIGNAL WAVEFORM

BACKGROUND

The technology disclosed herein generally relates to systems and methods for performing combined radar and communications functions.

Many platforms such as aircraft, satellites, submarines and vehicles require both radar and communications functions. However, existing solutions for both radar and communications functions require the addition of two separate systems with all their attendant cost, power and antennas on a platform with scarce free locations for such hardware.

One problem is the lack of space to install these two presumably separate sets of hardware (radar and communications). While they might be able to share an antenna if they are nominally at the same frequency, this is prevented due to the stove-piped implementation of such different systems. A second problem is the cost associated with interference (primarily radio frequency (RF) interference) of two such systems on a single platform. When radar and communications systems are separate, they can be operated at different times or at the same time. When operating at the same time, co-channel interference may be an issue and may limit the performance of one or both systems. Operating at different times causes performance restrictions. A third problem is the additional cost of maintaining two separate systems, as well as their required upgrades.

It would be desirable to provide a system that solves one or more of the aforementioned problems when implementing both radar and communications functions.

SUMMARY

The subject matter disclosed in detail below is directed to a system and a method that solves one or more of the above-identified problems by using a common set of programmable hardware and software that implements both radar and communications functions in a flexible manner so that one system can provide both of the required radar and communications performances. More specifically, this disclosure describes a set of common hardware and common signal processing together with a common waveform family that can be used for both radar and communications functions. These two applications typically use separate hardware, software and signals. This disclosure describes how a single waveform can be used on the same hardware using the same signal processing architecture to achieve both efficient radar and efficient communications functions. This waveform will be referred to in this disclosure as a combined radar/communications waveform (CRCW) and is based on a frequency-modulated continuous waveform (FMCW). This CRCW is part of a combined radar/communications function that can be implemented using a common antenna, common power and common location on aircraft, satellite, submarine or other vehicles to provide both types of functions.

Such a combined system may reduce cost, size, weight and power of the final installed radar and communications systems through this commonality as well as provide easier maintenance and upgrades. By implementing the radar and communications systems together, almost all the interference problems can be addressed within the common system, rather than waiting for installation at different places on the platform and then analyzing such interference. By using common hardware and processing, upgrades of both systems can be accomplished at the same time and integration problems would be already taken care of. The common waveform proposed herein avoids the problems associated with operating separate systems and allows both radar and communications functions to operate at the same time without interference or reducing the performance of one at the expense of the other.

The communications function disclosed herein uses digital modulation, in which changes in phase, magnitude and frequency are used to represent digital information. In a digital modulation scheme, each transmitted bit (or groups of bits) is mapped to a particular state of the carrier wave. As used herein, the term "symbol" means the state of the carrier, which is defined as having a specific phase, magnitude and frequency. The rate at which the carrier changes state from one symbol to the next is called the symbol rate.

Although various embodiments of systems and methods for performing combined radar and communications functions will be described in some detail below, one or more of those embodiments may be characterized by one or more of the following aspects.

One aspect of the subject matter disclosed in some detail below is a combined radar/communications system comprising a common radar/communications transmitter having a transmission antenna and a combined radar and communications receiver having a common reception antenna, wherein the common radar/communications transmitter is configured to transmit combined radar/communications waveform-modulated signals comprising symbols, each symbol consisting of an up chirp and a down chirp, and the combined radar and communications receiver comprises: a first mixer that mixes received signals from the reception antenna with the transmitted signals and outputs first demodulated signals; a baseband radar signal processing module configured to estimate range and range rate of a radar object based on beat frequencies derived from the first demodulated signals; a second mixer that mixes received signals from the reception antenna with a frequency-modulated signal having a center frequency of a transmitting communications platform located at a distance from the common reception antenna and outputs second demodulated signals; and a baseband communications signal processing module configured to detect slopes and initial phases of the up and down chirps of each symbol in the second demodulated signals. The up and down chirps of successive symbols have non-uniform slopes and non-uniform initial phases.

In accordance with some embodiments of the system described in the preceding paragraph, the baseband communications signal processing module comprises: a phase estimator comprising hardware or firmware configured to estimate a respective instantaneous signal phase of the received signal for each signal sample; a slope coefficient estimator connected to the phase estimator and comprising hardware or firmware configured to estimate a slope coefficient for each symbol of the received signal; a pair of phase coefficient estimators configured to estimate a respective phase coefficient for each of the up and down chirps for each symbol in the received signal; and a slope/phase-to-symbol mapping module configured to compute three indices identifying each symbol based on the estimated slope coefficient and the pair of estimated phase coefficients.

Another aspect of the subject matter disclosed in some detail below is a combined radar and communications receiver comprising: a reception antenna; a first mixer that mixes received signals from the reception antenna with transmitted signals transmitted by a first transmitter and outputs first demodulated signals; a baseband radar signal processing module configured to estimate range and range rate of a radar object based on beat frequencies derived from the first demodulated signals; a second mixer that mixes received signals from the reception antenna with a frequency-modulated signal having a center frequency of a second transmitter and outputs second demodulated signals; and a baseband communications signal processing module configured to detect slopes and initial phases of up and down chirps of each symbol in the second demodulated signals.

A further aspect of the subject matter disclosed in some detail below is a method for operating a combined radar/communications system, comprising: transmitting combined radar/communications waveform-modulated signals comprising symbols using a transmission antenna, each symbol consisting of an up chirp and a down chirp; receiving at a reception antenna portions of the combined radar/communications waveform-modulated signals returned from a radar target; mixing received signals from the reception antenna with the transmitted signals to produce first demodulated signals; deriving beat frequencies from the first demodulated signals; estimating range and range rate of a radar object based on the beat frequencies; mixing received signals from the reception antenna with a frequency-modulated signal having a center frequency of a transmitting communications platform located at a distance from the common reception antenna to produce second demodulated signals; and detecting slopes and initial phases of the up and down chirps of each symbol in the second demodulated signals.

In accordance with some embodiments of the system described in the preceding paragraph, detecting slopes and initial phases comprises: estimating a respective instantaneous signal phase of the received signal for each signal sample; estimating a slope coefficient for each symbol of the received signal; and estimating a respective phase coefficient for each of the up and down chirps for each symbol in the received signal. Then three indices identifying each symbol are computed based on the estimated slope coefficient and the pair of estimated phase coefficients.

Other aspects of systems and methods for performing combined radar and communications functions are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects.

Reference will hereinafter be made to the drawings in which similar elements in different drawings bear the same reference numerals.

DETAILED DESCRIPTION

Figure 1:
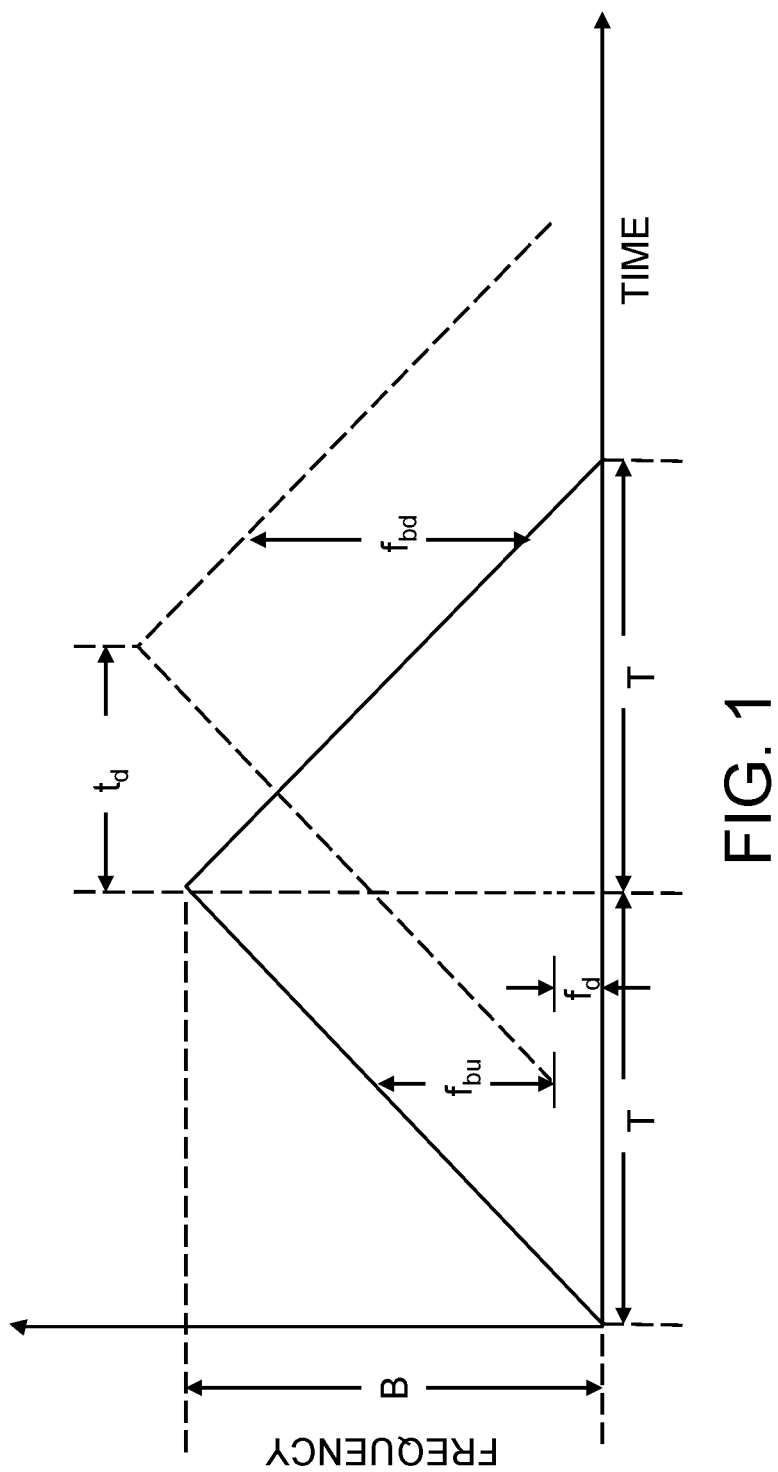
FIG. 1 is a graph representing received and transmitted frequencies of a triangular chirp waveform in which the up and down ramps have equal time durations. The solid lines represent the transmitted signal; the dashed lines represent the reflected and received signal.

Illustrative embodiments of systems for detecting and estimating parameters for phase-modulated signals are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Radar signals typically fall into two categories: pulsed signals and continuous signals. Pulsed signals are on for a short period of time and then turn off and wait for a returned echo. In contrast, frequency-modulated continuous wave (FMCW) radar typically uses a frequency-modulated continuous signal that bounces off the targets continuously and returns to the receiver. In particular, a linear frequency sweep is usually applied and the returned signal can be mixed with the transmitted signal to produce a single expected tone for each target return. This linear frequency sweep is also called a linear chirp or linear frequency-modulated signal. There are a number of advantages to using FMCW radar in comparison to pulsed radar.

One advantage of FMCW radar is the low peak transmit power. Only a very small fraction of the transmitted signal is reflected back to the radar receiver. Since pulsed radars transmit only for a short period of time, the peak transmit power is high relative to the mean transmit power. This typically requires using large, heavy, inefficient, high-voltage klystron components. In comparison, the continuous transmission of FMCW radar means that the same average transmit power can be achieved using a significantly smaller peak power which is more typical of a communications system in terms of power and cost. This allows a combined FMCW radar/communications system to be built using lower-cost, efficient solid-state components. Low power consumption means that such a system may be easily powered on smaller platforms and have wider usage.

Another advantage of FMCW radar is the high range resolution. The range resolution of a radar determines the minimal range separation to distinguish between two distinct targets. In a simple pulsed radar, higher range resolution is achieved by shortening the pulse duration and thereby increasing the bandwidth of the pulse. However, component switching time and the need to further increase transmit power limit the achievable range resolution. Instead, the range resolution of an FMCW radar is determined solely by the bandwidth of the chirp and is independent of the chirp duration. This permits finer range resolution to be achieved for a given cost effective solution.

A further advantage is that FMCW radar enables short-range measurement. Pulsed radars do not transmit and receive simultaneously and therefore have a minimum measurement range. By contrast, FMCW radars transmit and receive simultaneously and are capable of very short minimal measurement ranges. One limitation of an FMCW radar is the presence of a large direct current component in the demodulated FMCW intermediate (IF) frequency which should be filtered to prevent amplifier saturation. However, FMCW radar is able to achieve much shorter range measurements than pulsed radar.

Yet another advantage of FMCW radar is high-frequency operation. FMCW impose no requirement on operating frequency and in fact high-frequency operation is desirable as an equivalent beam-width can be achieved with a physically smaller antenna. Additionally, since the range resolution depends only on the chirp bandwidth, the bandwidth as a percentage of the carrier frequency is smaller, so that components are more easily available.

Another advantage of FMCW radar is that chirp duration may be arbitrary. In a simple pulsed radar, pulse duration and pulse bandwidth are inversely proportional. In the case of FMCW radar, chirp duration and chirp bandwidth are completely independent. Therefore, chirp duration can be increased while maintaining a fixed range resolution to achieve a desired received signal-to-noise ratio (SNR) in order to limit power consumption, to reduce interference or to reduce the probability of interception. Hence this trade can also be done for communications reasons to achieve all the same goals.

There are several disadvantages for FMCW radar over pulsed radar. These can be mitigated with proper design.

One disadvantage of FMCW radar is range-velocity ambiguity. Since range to target is encoded in frequency, any Doppler shift from target movement alters the apparent target range. This ambiguity can be removed by comparing the phase progression of a target across a series of consecutive chirps or by using a series of up and down chirps to simultaneously measure target range and range rate.

Another disadvantage of FMCW radar is chirp non-linearity. While range resolution is determined by the chirp bandwidth, any deviation from a perfectly linear frequency ramp will cause the target-induced IF frequency to vary across the duration of the chirp, degrading the range resolution of the radar. Thus, either the voltage-controlled oscillator is required to have higher linearity than in some more standard radio applications, or compensation can be applied to correct these non-linearities.

A further disadvantage of FMCW radar is transmitter leakage. Typical target return power is far smaller than the transmit power. Because FMCW radars transmit and receive simultaneously, even very small amounts of transmitter leakage can overwhelm the target return, potentially damaging sensitive radiofrequency (RF) receiver components. In addition, single antenna designs (while more compact than two antenna designs) require additional isolation and the use of an RF circulator. There are a number of RF techniques available to suppress this leakage in order to achieve good performance in single antenna radars, but all such methods allow simultaneous communications as well.

Yet another disadvantage of FMCW radar is phase coherency. Since FMCW radar down-converts the received radar return signal against the original transmitted signal by mixing and low-pass filtering, it is necessary that the receiver remain phase coherent during the time between transmission and reception. This is true for pulsed radars as well, so this can be achieved. However, communications systems may have looser requirements. This is another area where the greater demands for radar processing must be met in order to achieve both radar and communications with a single system.

Radar and communications system requirements force design choices with respect to the amount of signal power. The respective optimum signal strengths are described briefly below, emphasizing the differences. For a combined system, both signal strength criteria should be met.

A radar's principle of operation is based on the properties of electromagnetic waves and their characteristic reflection by different materials. First, a radio signal of frequency f and wavelength $\lambda=c/f$ is transmitted. Based on the reflected and received signal response, measurements regarding direction, distance, and relative velocity of the reflecting target can be made. The received signal strength of the target can be calculated from the radar equation:

$$P_r = \frac{P_t G_t A_r \sigma_S}{(4\pi)^2 R^4} \text{ with } A_r = \frac{G_r \lambda^2}{4\pi}$$

In the above expression, $P_r$ denotes the received signal strength, while $P_t$ represents the transmitted signal power. The antenna is characterized by its transmit and receive antenna gains $G_t$ and $G_r$ respectively as well as the corresponding effective aperture $A_r$ of the receiving antenna. $\sigma_S$ is the scattering cross section of the reflecting target which is located at the distance R. The received signal strength degrades with the fourth power of range. This is in contrast to general communication systems which only degrade with the second power of range. Thus, for the communications case, the power $P_c$ received by the communications receiver (at a range R from the transmitter, instead of co-located) has no reflection and only an $R^2$ loss, and may be expressed as $$P_c = \frac{P_t G_t A_c}{4\pi R^2} \text{ with } A_c = \frac{G_c \lambda^2}{4\pi}$$

where $A_c$ is the aperture of the receiving communications antenna with its associated gain $G_c$. Therefore, the radar receiver has to provide a higher sensitivity and dynamic range in order to cover a wide range of target distances. What this means is that with a common radar/communications signal and hence a common antenna and transmit power, the maximum range of the radar signal $R_{max}$ is typically much less than the range of the communications signal $R_{comm}$, i.e., $R_{max} < R_{comm}$.

These considerations affect the designed amplitude of the transmitted common radar/communications signal and the front-end RF hardware, but are purely application specific and do not affect the waveform design and processing and so are not further discussed herein. Henceforth the signal is assumed to be normalized to unity in amplitude.

The transmitted linear frequency-modulated signal of an FMCW radar system can be modeled as a linear chirp:

$$s_T(t) = \cos(2\pi f_c t + 2\pi \int_0^T f_T(\tau)d\tau)$$

where $f_T(\tau) = (B/T)\tau$ is the transmit frequency as a linear function of time $\tau$ (for an up ramp; a down ramp would be negative), $f_c$ is the carrier frequency, B is the bandwidth, the amplitude is normalized to unity, and T is the time duration. Considering a reflected and received signal with a time delay $t_d = 2(R_0 + vt)/v_c$ and a Doppler shift $f_D = 2 \cdot f_c v/v_c$, where $v_c$ is the velocity of light (for RF signals), the received frequency after mixing the transmitted signal with the received signal can be expressed as $$f_R(t) = \frac{B}{T}(t - t_d) + f_D$$

where $R_0$ is the range at time $t=0$ and v is the target velocity (or range rate). Thus the received up ramp signal can be described as $$s_R(t) = \cos\left(2\pi\left(f_c(t-t_d) + \frac{B}{T}\left(\frac{t^2}{2} - t_d t\right) + f_D^i\right)\right)$$

Here the received signal amplitude is normalized to unity. In fact, the received signal amplitude depends on antenna gains, transmitted power, the target's distance and radar cross section (RCS). To obtain information about the Doppler frequency and beat frequency, the transmitted signal $s_T(t)$ and the received signal $s_R(t)$ are mixed by multiplication in the time domain and passed to a low-pass filter (LPF) with a bandwidth B. The intermediate frequency (IF) signal $s_{IF}(t)$ of the LPF output is then obtained for an up ramp as $$s_{IF}(t) = \frac{1}{2}\cos\left(2\pi\left(f_c \cdot \frac{2R_0}{v_c}\right) + 2\pi\left(\frac{2R_0}{v_c} \cdot \frac{B}{T} + \frac{2f_c v}{v_c}\right)t\right)$$

Similarly, the IF signal $s_{IF}(t)$ of the LPF output can be obtained for the down ramp (with the same slope as the up ramp, but the opposite sign) as follows $$s_{IF}(t) = \frac{1}{2}\cos\left(2\pi\left(f_c \cdot \frac{2R_0}{v_c}\right) + 2\pi\left(-\frac{2R_0}{v_c} \cdot \frac{B}{T} + \frac{2f_c v}{v_c}\right)t\right)$$

Hence, two time-dependent frequency terms called the up and down ramp beat frequencies appear in the spectrum of the baseband signal:

$$f_{bu} = \frac{2R_0}{v_c} \cdot \frac{B}{T} + \frac{2f_c v}{v_c} \quad (1)$$

$$f_{bd} = -\frac{2R_0}{v_c} \cdot \frac{B}{T} + \frac{2f_c v}{v_c} \quad (2)$$

These frequencies may be used to solve for target velocity v and range $R_0$. (The references: Rohling and Meinecke, "Waveform design principles for automotive radar systems", 2001 CIE International Conference on Radar (2001), and Rohling and Moller, "Radar waveform for automotive radar systems and applications", 2008 IEEE Radar Conference, 26-30 May (2008), contain this information and references to the papers where the frequencies are derived.) FIG. 1 shows the frequencies for the transmitted (solid lines) and received (dashed lines) signals having a triangular waveform, where $f_{bu}$ and $f_{bd}$ denote the up ramp beat frequency and down ramp beat frequency, respectively.

This disclosure proposes to use a combined waveform having a design that is based on the above-described up and down chirps, so that the radar function is essentially unaffected, but is parameterized in two ways to allow communications to take place:

(1) Each symbol will be of length 2T and have two chirps, one up and one down. Note that one could also use a down chirp followed by an up chirp. The following discussion standardizes on up, then down chirps. The up chirp will start with a frequency $f_c - B/2$ at time 0 and then go to a frequency $f_c + B/2$ at time $T_i$; then the complementary down chirp will start with a frequency $f_c + B/2$ at time $T_i$ and end at a frequency $f_c - B/2$ at time 2T for symbol i. Let the two different chirp slopes be labeled $a_i$ and $a_1$, and the two different frequencies be labeled $b_i$ and $\beta_i$. Their values can be related to the chirp parameters by $a_i = B/T_i^2$, $b_i = f_c - B/2$, $\alpha_i = -B/(2T-T_i)$, and $\beta_i = f_c + B/2$.

(2) Each symbol will have a separate initial phase for each chirp: phase $c_i$ for the first chirp and phase $\gamma_i$ for the second chirp. Here $-\pi < c_i, \gamma_i \leq \pi$.

These changes will not impact the radar performance of the waveform at all. The only changes to derive range and range rate have to do with measuring the beat frequency during the two intervals [0, $T_i$) and ($T_i$, T], instead of the two intervals [0, T) and (T, 2T]. The equations for the two intervals can be represented in the following forms:

$$\exp(2\pi j(a_i t^2 + b_i t + c_i)), \quad 0 \leq t < T_i$$

$$\exp(2\pi j(\alpha_i(t-T_i)^2 + \beta_i(t-T_i) + \gamma_i)), \quad T_i \leq t < T$$

In its most general form, the CRCW can be represented by multiple parallel (contiguous or non-contiguous) channels (m in number) having frequency bands $B_i$, where i=1, 2, ..., m. Each frequency band has its own symbol times, chirp slopes and phases within an overall range of frequencies having a total bandwidth $B_T$ that represent all the radar and communications systems that are currently operating. FIG. 2B shows this design in which a respective series of symbols, each symbol including an up chirp and a down chirp as described above, are transmitted in respective channels of width B centered on respective different carrier frequencies.

Figure 2A:
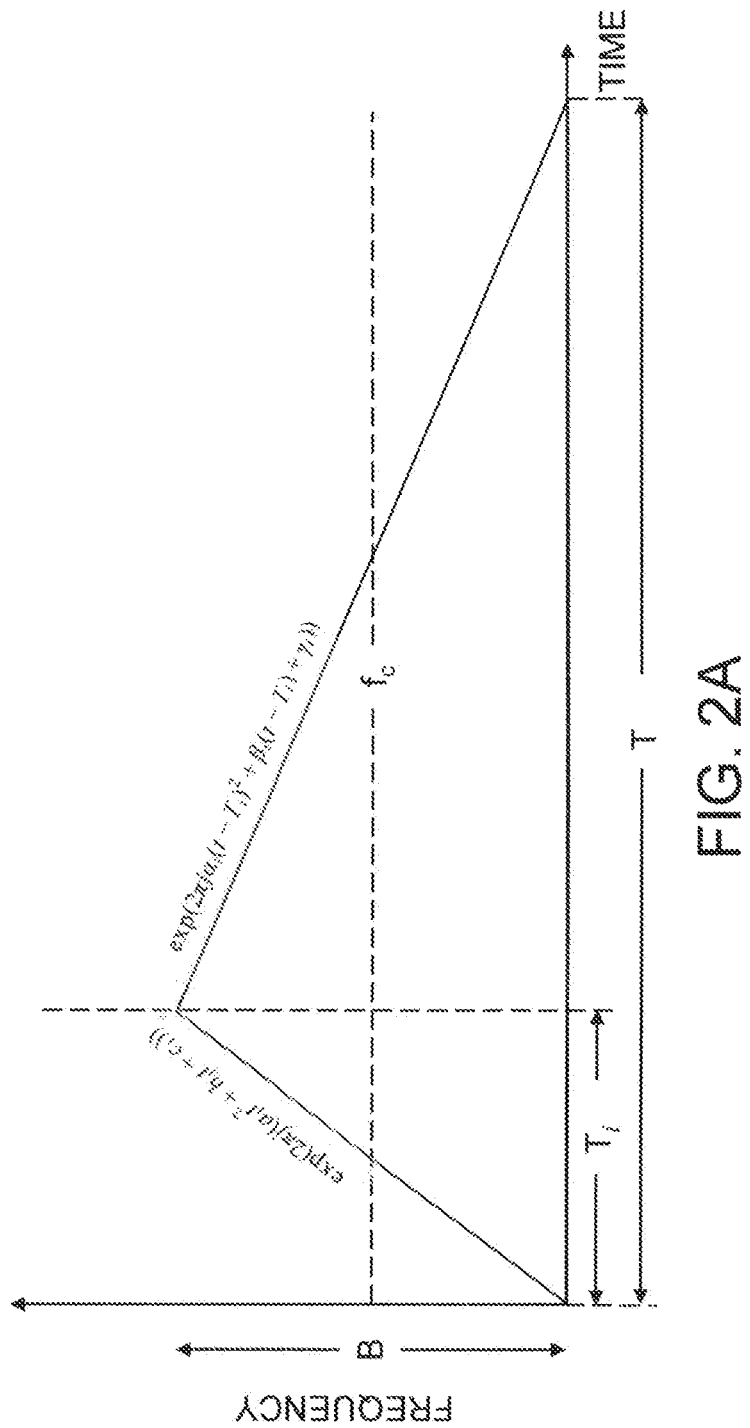
FIG. 2A is a graph showing a symbol design using linear frequency modulation to include one up chirp and one down chirp in each symbol.
Figure 2B:
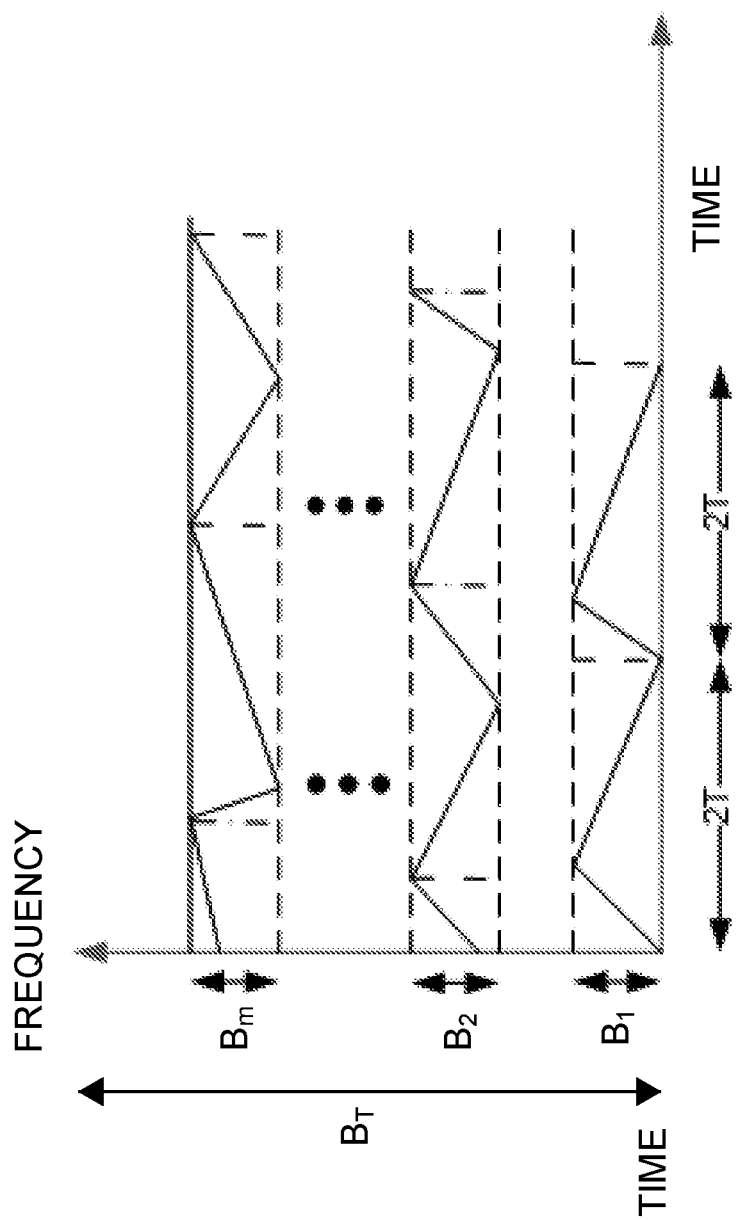
FIG. 2B is a graph representing frequencies of chirp waveforms being transmitted in separate parallel channels.

In accordance with the methodology disclosed herein, symbols having waveforms of the types depicted in FIG. 2A may be transmitted concurrently. Similarly, the reflected and returned signals may be processed in parallel to derive various parameters characterizing the targets detected by the FMCW radar system.

The range resolution ΔR represents the minimum discernible range of two targets with the same velocity, and the velocity resolution Δv represents the minimum discernible velocity of two targets with the same range. The required bandwidth B is related to the given range resolution $\Delta R$ and can be formulated as $$B \geq \frac{v_c}{2\Delta R}$$

Similarly, the observation time T is related to the velocity resolution $\Delta v$ and can be expressed as $$T \geq \frac{v_c}{2f_c \Delta v}$$

The Nyquist sampling theorem then requires $$f_s(\text{radar}) \geq \frac{2BR_{max}}{v_c T} + \frac{2f_c v_{max}}{v_c}$$

in order to not have the maximum beat frequency fold over in the frequency domain. In order that the maximum return does not fold over in the time domain (folding into the next time interval T), a similar requirement is that $$t_d = 2\frac{R_{max} + v_{max}T}{v_c} < T$$

or $$T > \frac{2R_{max}}{v_c}$$

for reasonable velocities. These equations give a relationship between the radar performance parameters $\{R_{max}, v_{max}, \Delta R, \Delta v, f_c\}$ and the waveform parameters $\{B, T, f_s\}$. Note that for a given CRCW symbol with durations $T_i$ and $2T-T_i$ for the two chirps, T in the above equations would be replaced by one of these two quantities depending on which part of the symbol is being referred to.

For communications functions using the CRCW, one may take the desired maximum data rate for communications in each channel m and find a bandwidth $B_m$ that will support that through standard communications analysis. The result is an available total bandwidth $B_T$. Then clearly $$\sum_m B_m \leq B_T$$

The sample rate of the communications receiver $f_s(\text{comm})$ after down conversion must satisfy the condition:

$$f_s(\text{comm}) \geq 2B_m$$

for each channel in order to capture the full bandwidth of the communicated signal.

For simplicity, the following additional disclosure assumes that each channel bandwidth is the same value B, meaning that the subscript m will be dropped. Suppose there are S symbols from a set $\{S_k\}$ defined by $\{T, T_i, \Theta_j, \Phi_l\}$ (where $0 < T_i < 2T$, $0 \leq i \leq C-1$, and $-\pi < \Theta, \Phi_l < \pi$, $j \geq 0$, $1 \leq C_1 - 1$, $C \cdot C_1^2 = S$), where $T_i$ is the length of time of the first chirp, B is the corresponding frequency range for both chirps (all symbols will have the same bandwidth and it is the same for both up and down chirps), and $\Theta_j$ and $\Phi_l$ are the corresponding phases of the up and down ramps.

To support a required data rate A bits per second, one should have $$A \leq \lfloor \log_2(S) \rfloor / 2T \lfloor B_T/B \rfloor$$

where $\lfloor \log_2(S) \rfloor$ is the number of bits/symbol, $\frac{1}{2}T$ is the number of symbols per second, and $B_T$ is the total bandwidth allocated (via regulation, hardware limits, etc.) for the combined radar/communications system. If all of the limits on the chirp periods are combined, the result is $$T_i, 2T - T_i \geq T_{min} \geq \max\left\{\frac{2R_{max}}{v_c}, \frac{v_c}{2f_c \Delta v}\right\}$$

and $$T \geq T_{max} \geq \max\{T_i, 2T - T_i\}.$$

Similarly, $$\log_2 S \geq 2AT / \lfloor B_T / B \rfloor$$

and $$f_s \geq \max\left\{B, \frac{2BR_{max}}{v_c T} + \frac{2f_c v_{max}}{v_c}\right\}$$

Let the number of unique chirp times (the unique values in $\{T_i\}$) (or equivalently the number of unique positive frequency slopes for the symbol set) be C. These conditions can be met via the following equations:

$$T = (T_{min} + T_{max})/2$$

$$T_i = T_{min} + (T_{max} - T_{min}) \cdot i/(C-1)$$

for $i=1, \ldots, C-1$ as an example. Then the complementary duration $$2T - T_i = T_{max} - (T_{max} - T_{min}) \cdot i/(C-1)$$

is simply the reverse list of the $\{T_i\}$, simplifying the receiver and transmitter design.

With no other limits on the phases and a symbol defined by a phase pair $$\langle \Theta, \Phi \rangle$$

there can be $\lceil = \sqrt{S/C} \rceil$ unique values of each phase for both coordinates for a total of $D^2$ phases for each slope C. Thus the total number of symbols would then be $$C \cdot D^2 = C \cdot \lceil \sqrt{S/C} \rceil \cdot \lceil \sqrt{S/C} \rceil$$

which is greater than S as required. A simple assumption is to spread the phases evenly over $(-\pi, \pi]$ via the following phase definitions:

$$\Theta_j = -\pi + 2\pi j/C_1$$

$$\Phi_l = -\pi + 2\pi l/C_1$$

for $j, l = 1, \ldots, D-1$.

Together (both radar and communication cases), the above description has defined almost all of the basic waveform parameters $$\{S, B, T, f_s, \{T_i\}, \{\Phi_j\}, \{\Theta_l\}\}$$

using the requirement/design parameters $$\{R_{max}, v_{max}, \Delta R, \Delta v, f_c, B_T, A\}.$$

Note that the amplitude A (which was normalized to unity in the above discussion) has not been discussed because amplitude is better handled through the link budget and RF front-end hardware, which are purely application specific, as described above. The remaining values C and D give a way to adjust the spread of symbols so as to give the best and most consistent symbol detection performance as a function of SNR. This balance of slope versus phase (C and D) is described in the following paragraphs.

A method for balancing symbol slopes and phases will now be described in some detail. The following discrete chirp model will be used in order to estimate variance:

$$s[n] = A \exp(j(2\pi j(\alpha m^2 + \beta n + \gamma))$$

$$z[n] = s[n] + w[n]$$

$$m = n - (N-1)/2, 0 \le n \le N-1 \qquad (3)$$

where $s[n]$ is the sampled version of a symbol, $z[n]$ is the sampled received signal plus noise, and $w[n]$ is the sampled version of the received noise with a standard deviation of $3\sigma$. The value N is the number of samples during the chirp period. The parameters $\{\alpha, \beta, \gamma\}$ define each chirp of the two-chirp set that corresponds to a symbol and respectively correspond to chirp rate (or frequency slope of chirp), frequency and phase. This disclosure employs modified approximations to the Cramer-Rao lower bound for the variance estimators of each parameter using the following notation:

$$\text{var}\{\hat{\alpha}\} \gtrsim \left(\frac{\sigma}{\pi A}\right)^2 \frac{90}{NT^4} \qquad (4)$$

$$\text{var}\{\hat{\beta}\} \gtrsim \left(\frac{\sigma}{\pi A}\right)^2 \frac{6}{NT^2} \qquad (5)$$

$$\text{var}\{\hat{\gamma}\} \gtrsim \left(\frac{\sigma}{\pi A}\right)^2 \frac{9}{8N} \qquad (6)$$

This information can be used to choose a balance between the number C of different frequency slopes and number D of different phases.

A specific example will now be described to show how to balance the values of C and D as a function of the other waveform parameters. Suppose that B=1 MHz and $T_{min}$=10 µs. And suppose that the chirp bandwidths for the symbols are equally spaced in frequency. In particular, assume that the maximum slope is $$\alpha_{max} = \frac{B}{T_{min}}$$

and then distribute the frequency slope values evenly to cover the full range to this maximum. This equation follows from the following observations. The Doppler equation relates transmit frequency f versus apparent observed frequency f' due to relative motion. So $$f' = \frac{v_c + v_0}{v_c + v_s} f$$

where $v_c$ is the velocity of the signal (the velocity of light for RF signals), $v_0$ is the signed velocity of the observer, and $v_s$ is the signed velocity of the source (transmitter). Thus the received chirp may be shifted in frequency from the transmitted chirp by the ratio $(v_c+v_0)/(v_c+v_s)$. This essentially changes the value of $\beta$ of the received signal to $$\beta' = \frac{v_c + v_0}{v_c + v_s} \beta$$

where $\beta$ is the starting frequency of the transmitted chirp and $\beta'$ is the starting frequency of the received chirp. Because of the way the received signal is processed (described in some detail below), the estimation of $\beta$ may be avoided without affecting receiver performance.

Figure 3:
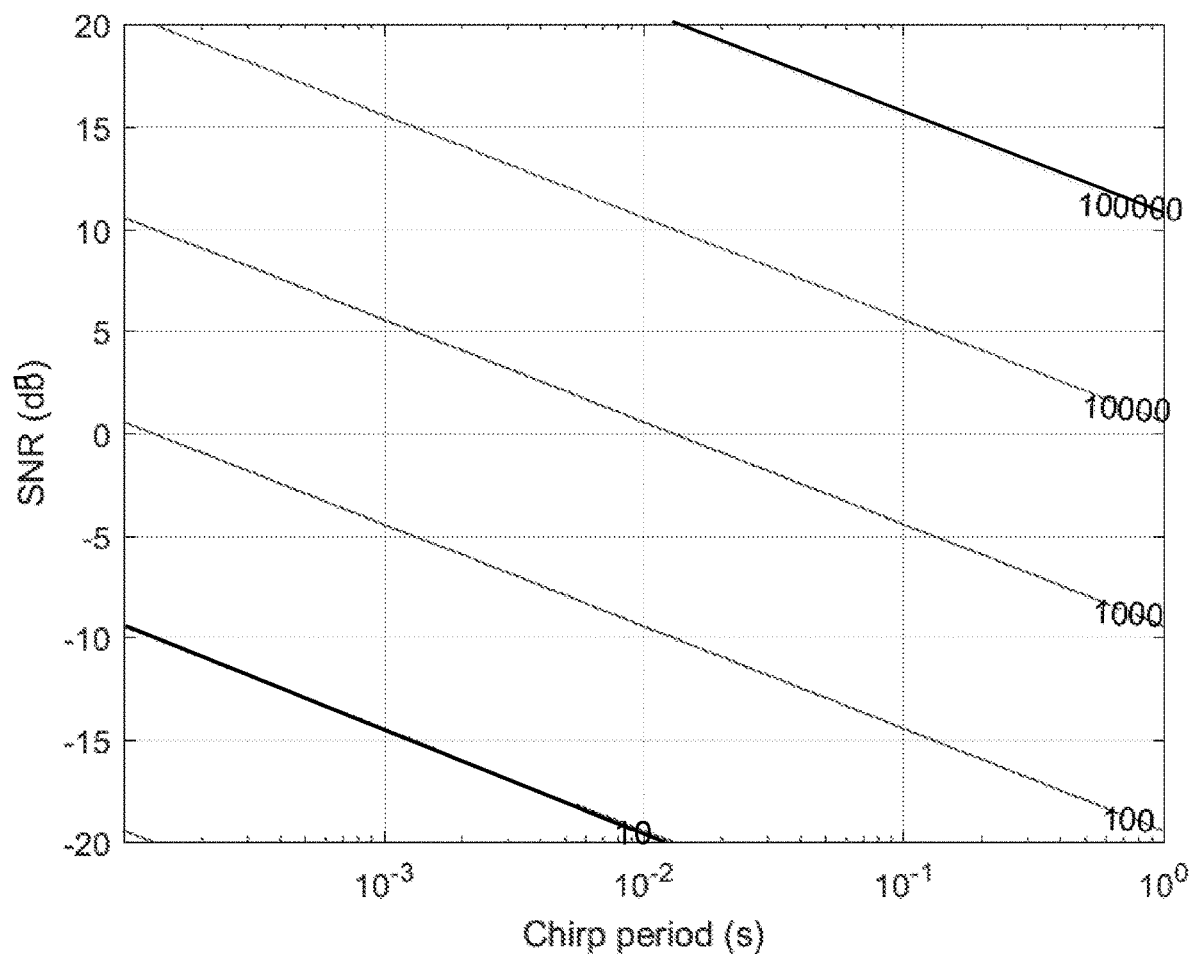
FIG. 3 is a graph of signal-to-noise ratio (SNR) versus chirp period showing a number of 3σ separated chirp slopes (C) for an example in which B=1 MHz and $T_{min}$=10 μs.
Figure 4:
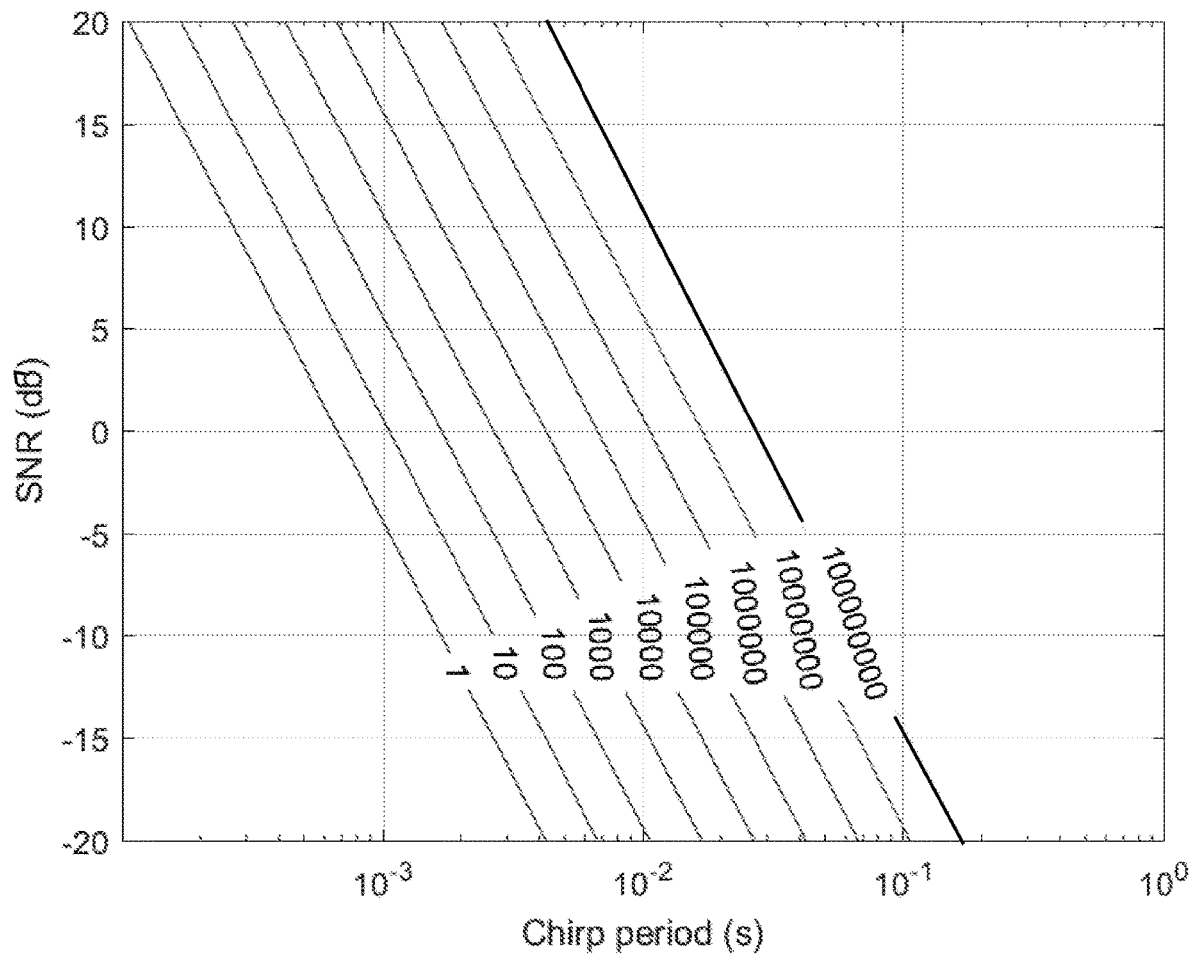
FIG. 4 is a graph of SNR versus chirp period showing a number of 3σ separated chirp phases ($C_1$) for an example in which B=1 MHz and $T_{min}$=10 μs.
Figure 5:
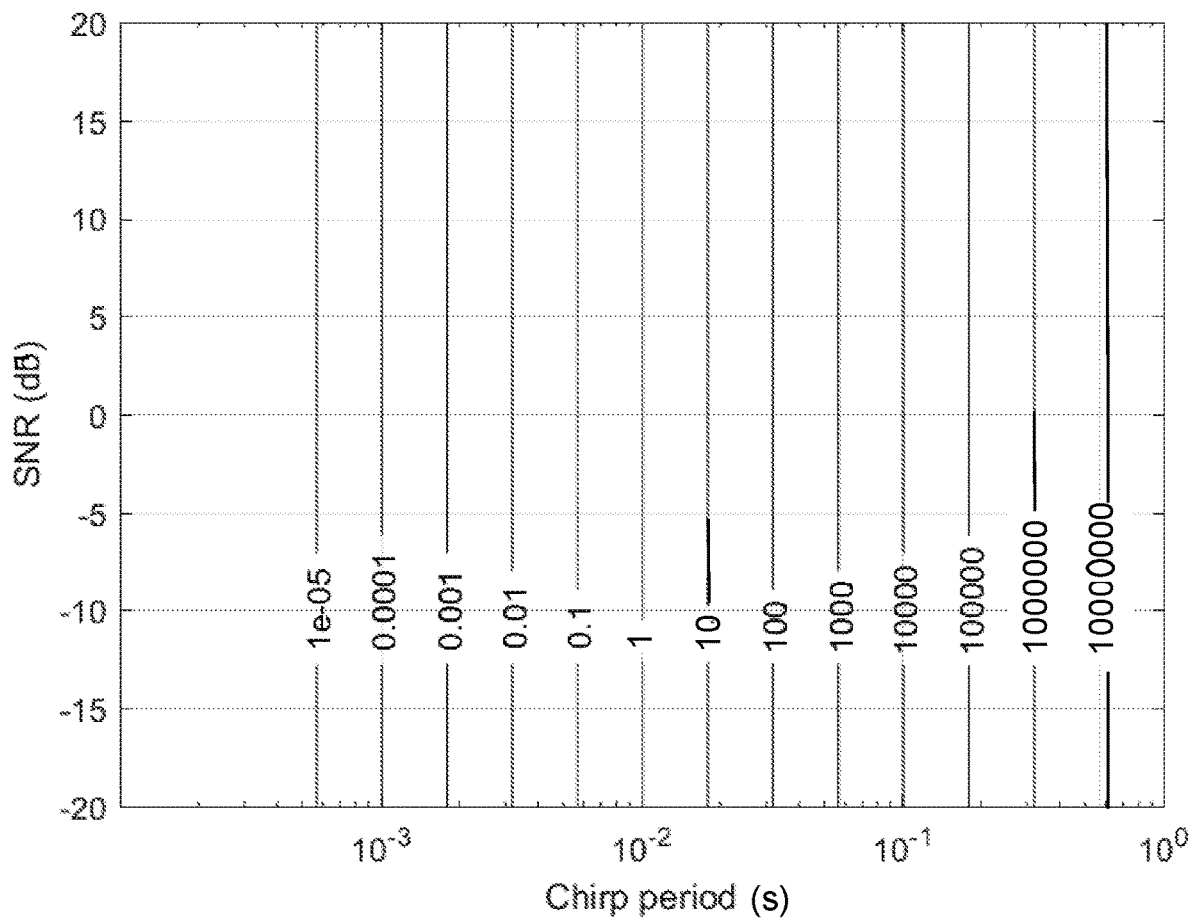
FIG. 5 is a graph of SNR versus chirp period showing the optimal ratio of slope over phase squared for an example in which B=1 MHz and $T_{min}$=10 μs.

FIGS. 3 and 4 show the results of using the variance estimator equations (4) and (6) to see the maximum theoretical values for C and D in given situations as a function of N and SNR at the $3\sigma$ detection level. This $3\sigma$ detection level means that ≈99.7% of the time, the correct chirp slope/phase can be detected. This corresponds roughly to a communications system operating at a symbol error rate of 0.009. Using error correction coding on this combined radar/communications system is not disclosed in detail herein because it would be done in a conventional manner to move from its symbol error to a required bit error rate of, typically, $1 \times 10^{-10}$. By computing the performance for the slope versus phase detection, one can balance the two in order to achieve an optimal performance ratio. Thus one would adjust the balance of the number of unique positive chirp slopes versus the number of chirp phases for a given system. FIG. 5 shows the optimal ratio of $C/D^2$ (the ratio of unique positive slopes to unique phase pairs) as a function of N and SNR at the $3\sigma$ detection level. Note that this ratio can vary widely in different situations. Also, note that if system considerations do not allow usage of the full slope range, the slopes can cover a smaller range (e.g., if range resolution requires a tighter range of bandwidths), in which case the number of $3\sigma$ separated phases would be reduced and the optimal ratio would change.

Some components of a simplified FMCW radar system 100 that is not configured to use the waveforms disclosed hereinabove are identified in FIG. 6. The FMCW radar system 100 may installed on a vehicle such as a car, a bus, a truck, etc., for measuring the range of a radar target 102, such as another vehicle or a person, and sending out an alarm signal when the measured range is less than a specified minimum separation distance. The FMCW radar system 100 is functionally divided into a transmission portion and a reception portion. The transmission portion includes an up/down ramp controller 104, a digital-to-analog (D/A) converter 105, a frequency-modulated continuous waveform generator 106, a voltage-controlled oscillator (VCO) 107, a transmission amplifier 108, and a transmission antenna 110 connected in series. The reception portion includes a reception antenna 116, a low-noise reception amplifier 118, a frequency mixer 120 (which is also connected to VCO 107), a low-pass filter 122, an analog-to-digital (A/D) converter 124, and a baseband radar signal processing module 126 (which is also connected to the up/down ramp controller 104) connected in series. A modulated signal is transmitted and received through the antennas, and the transmitted and received signals are multiplied in the time domain, filtered and processed to find the peaks in frequency which correspond to target returns. The final result is a stream of measurements including range and range rate (relative velocity) of all the targets present.

Sensing operations of the FMCW radar system 100 can be briefly described as follows. The up/down ramp controller 104 outputs digital control signals to the digital-to-analog converter 105, which converts the digital signals into analog signals that control the frequency-modulated continuous waveform generator 106 to generate frequency-modulated continuous waveforms, which the VCO 107 converts to FMCW signals having a carrier frequency $f_c(Tx)$. The FMCW signals are amplified by transmission amplifier 108 and emitted as RF electromagnetic waves 112 toward the radar target 102 by the transmission antenna 110. Correspondingly, the reception antenna 116 receives RF electromagnetic waves 114 reflected from the radar target 102. The reception antenna 116 acts as a transducer to convert the reflected RF electromagnetic waves into electrical signals which are amplified by low-noise reception amplifier 118. The frequency mixer 120 then frequency mixes the received signals output by the low-noise reception amplifier 118 with the transmitted signals having a carrier frequency $f_c(Tx)$ generated by the VCO 107 to produce first demodulated signals that contain phase information. The low-pass filter 122 performs low-pass filtering to obtain beat frequency signals between the transmitted and received signals. The analog-to-digital converter 124 samples the beat frequency signals and converts the beat frequency signals into digital signals. In order to compute information of the targets such as ranges and range rates, the baseband radar signal processing module 126 is configured to convert the digital beat frequency signals from the time domain to the frequency domain. A common method is using fast Fourier transforms. The up and down chirp signals are processed separately in two fast Fourier transforms. After fast Fourier transformation, the baseband radar signal processing module 126 finds the peaks in frequency, which correspond to target returns, utilizing a threshold value. The beat frequencies are then used to solve for target velocity v and range $R_0$, as previously described. The final result is a stream of measurements of range and target velocity (or range rate) for all targets present. In the example depicted in FIG. 6, the baseband radar signal processing module 126 is configured to compute and derive information about the target 102, such as range and range rate, and then store these radar measurements in a non-transitory tangible computer-readable storage medium 128.

Figure 6:
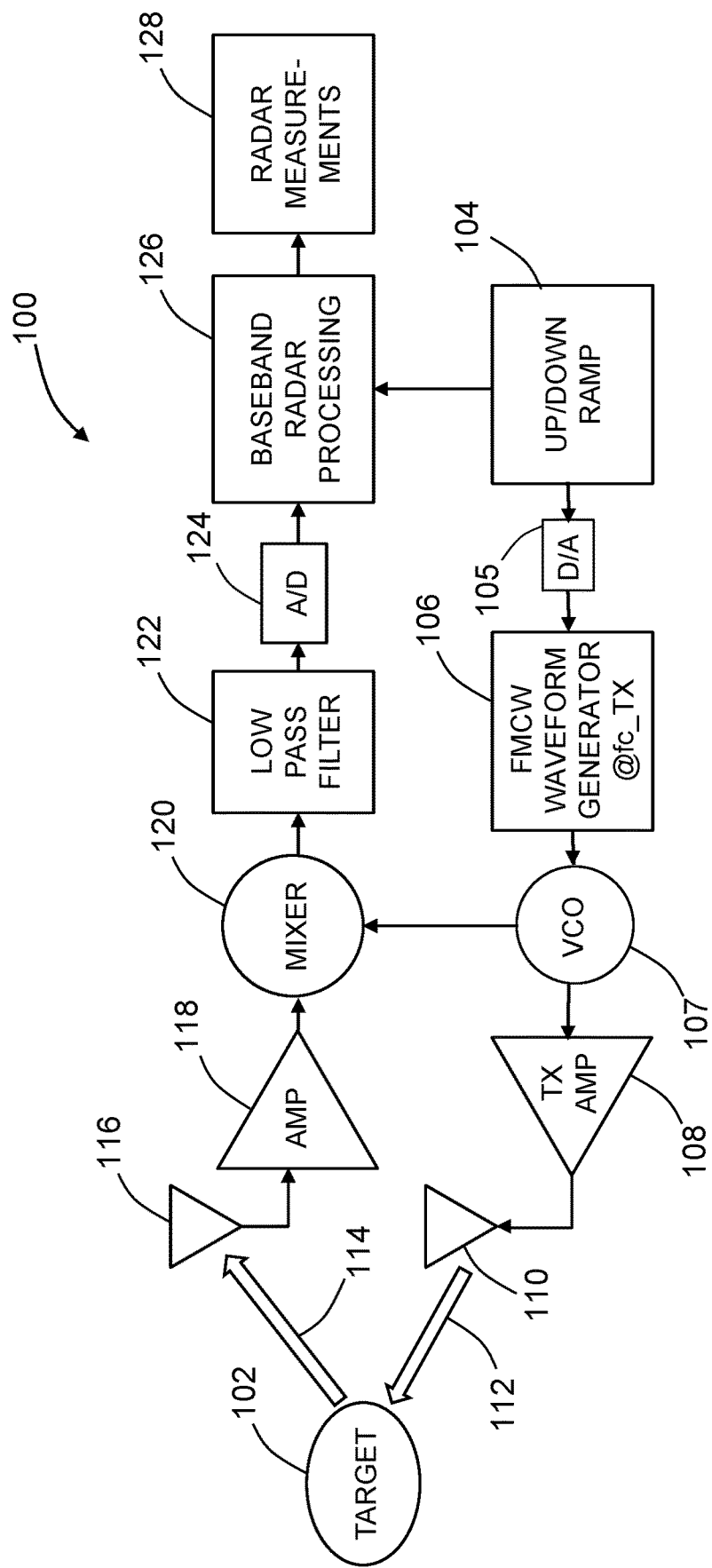
FIG. 6 is a block diagram identifying some components of a FMCW radar system that is not configured to use the combined radar/communications waveform disclosed herein.
Figure 7:
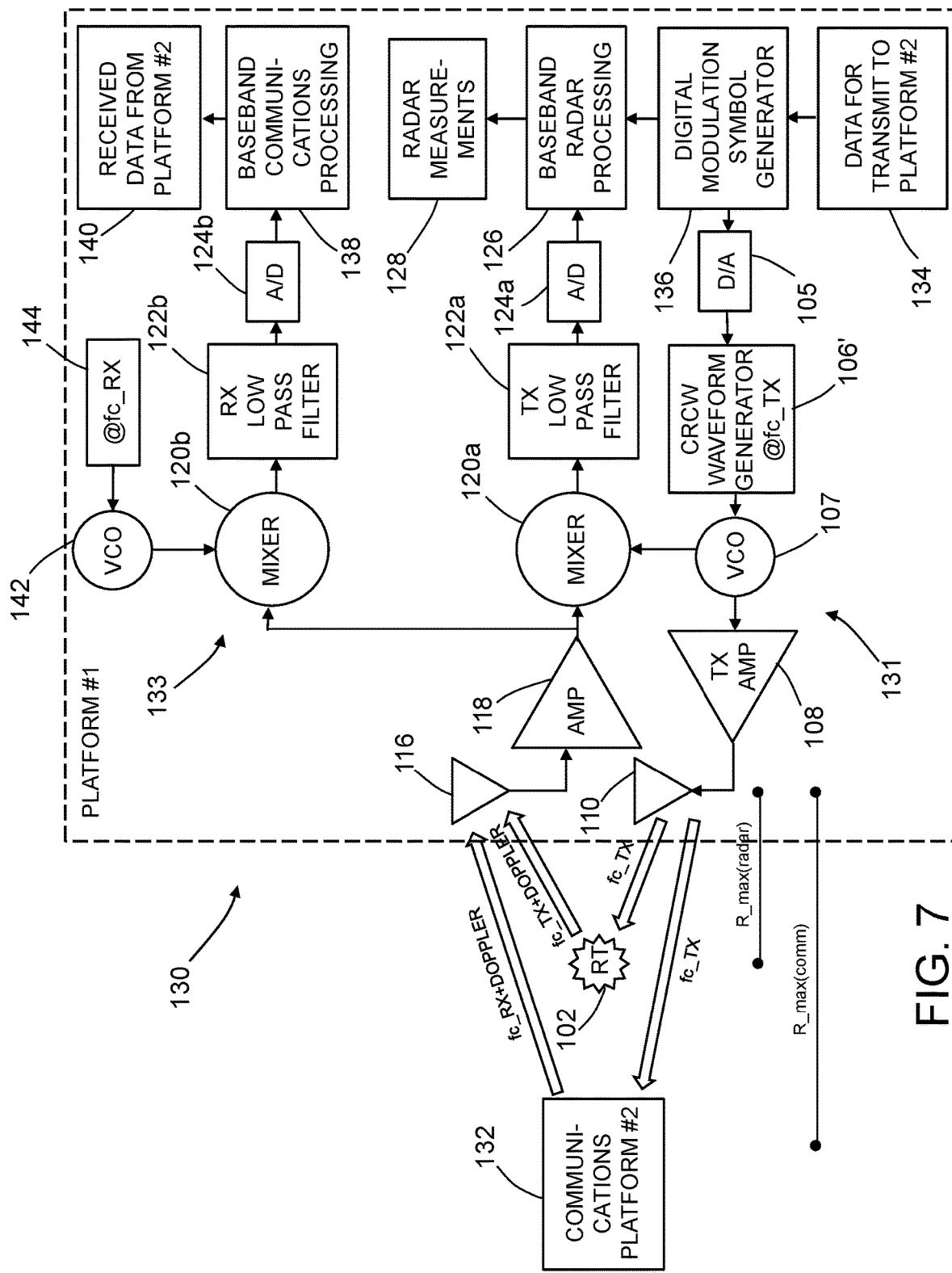
FIG. 7 is a block diagram identifying some components of a combined radar/communications system configured in accordance with one embodiment to use the combined radar/communications waveform disclosed herein.

By contrast, with a modification to the FMCW radar system partly depicted FIG. 6, a combined radar/communications system may be configured to use the previously described CRCW. FIG. 7 is a block diagram identifying some components of a combined radar/communications system 130 configured to use the CRCW disclosed herein. In the example partly depicted in FIG. 7, data may be transmitted from the combined radar/communications system 130 to a communications platform 132. Conversely, data may be transmitted from the communications platform 132 to the combined radar/communications system 130. Thus the combined radar/communications system 130 has both radar and communications data output and radar and communications data input. The radar portion is essentially unchanged from what is depicted in FIG. 6, merely requiring non-uniform symbol timing beyond the simpler FMCW radar system, which only needed uniform timing of the up or down chirp to compute the range and range rate.

The combined radar/communications system 130 includes a local transmitter and receiver which combine both radar and communications signals. The remote communications platform 132 that is communicating with combined radar/communications system 130 would typically use a different frequency band or bands for its communications. Thus FIG. 7 shows two different frequencies: fc_Tx (equal to $f_c(Tx)$) for the center frequency of the transmitter of the combined radar/communications system 130 (and of the radar receiver) and fc_Rx (equal to $f_c(Rx)$) for the center frequency of the communications receiver of the combined radar/communications system 130, which from the point of view of the remote communications platform 132 is the center frequency for its transmitter.

To clarify the terminology used herein, modulation is a process by which a carrier signal is altered according to information in a message signal. The transmission frequency $f_c(Tx)$ is the frequency of the carrier signal transmitted by a transmitter. The signal received by a receiver is demodulated using the same frequency. The demodulated signal is then sampled by the receiver. The sampling rate is the rate at which the message signal is sampled. The frequency of the carrier signal is usually much greater than the highest frequency of the input message signal. The Nyquist sampling theorem requires that the sampling rate $f_s$ be greater than two times the sum of the carrier frequency and the highest frequency of the modulated signal in order for the demodulator to recover the message correctly. To modulate a signal using digital modulation with an alphabet having M symbols, one may start with a real message signal whose values are integers from 0 to M−1.

In the example depicted in FIG. 7, the transmission antenna 110 of the combined radar/communications system 130 is transmitting RF electromagnetic waves having a transmit center frequency $f_c(Tx)$ toward a radar target 102 and toward a communications platform 132. In return, the reception antenna 116 of the combined radar/communications system 130 receives RF electromagnetic waves from the radar target 102 having a frequency equal to the center frequency $f_c(Tx)$ plus the Doppler frequency due to movement of the radar target 102 relative to the combined radar/communications system 130. The reception antenna 116 also receives RF electromagnetic waves from the communications platform 132 having a frequency equal to the center frequency $f_c(Rx)$ transmitted by the transmission antenna (not shown in FIG. 7) of the communications platform 132 plus the Doppler frequency due to movement of the communications platform 132 relative to the combined radar/communications system 130. As previously mentioned, the separate receive frequency channel for communications from the communications platform 132 uses a different center frequency $f_c(Rx)$ than the transmit center frequency $f_c(Tx)$ so that the two radar/communications transmitters do not transmit in the same frequency band.

Referring to FIG. 7, the transmitting portion (hereinafter "common radar/communications transmitter 131") of the combined radar/communications system 130 includes the following components connected in series: a communications data source 134 that stores data to be transmitted to communications platform 132; a digital modulation symbol generator 136 that converts the communications data to symbols; a digital-to-analog converter 105 that converts the digital symbols to analog symbols; a combined radar/communications waveform generator 106' that converts the analog symbols received from the digital-to-analog converter 125 into oscillator control voltages; a VCO 107 that applies a modulating signal to a carrier signal having a transmit frequency $f_c(Tx)$ based on the voltage control inputs and outputs CRCW-modulated signals; a transmission amplifier 108 that amplifies the resulting CRCW-modulated signals received from VCO 107; and a transmission antenna 110 that broadcasts the CRCW-modulated signals received from transmission amplifier 108.

Still referring to FIG. 7, the radar receiver and communications receiver (hereinafter collectively referred to as the "combined radar/communications receiver 133") of the combined radar/communications system 130 both receive signals via a reception antenna 116 and a low-noise reception amplifier 118. In the next paragraph, additional components of the radar receiver of the combined radar/communications receiver 133 will be described. Thereafter, additional components of the communications receiver of the combined radar/communications receiver 133 will be described.

The radar receiver of the combined radar/communications system 130 includes reception antenna 116, low-noise reception amplifier 118, a frequency mixer 120a (which is also connected to VCO 107), a low-pass filter 122a with a bandwidth B, an analog-to-digital converter 124a, and a baseband radar signal processing module 126 (which is also connected to the digital modulation symbol generator 136) connected in series. The reception antenna 116 receives RF electromagnetic waves reflected from the radar target 102. The reception antenna 116 converts the reflected RF electromagnetic waves into electrical signals which are amplified by low-noise reception amplifier 118. The frequency mixer 120a then frequency mixes the amplified signals output by the low-noise reception amplifier 118 with the signals having a carrier frequency $f_c(Tx)$ generated by the VCO 107 to produce first demodulated signals containing phase information. The low-pass filter 122a performs low-pass filtering to obtain beat frequency signals between the transmitted and received signals. The analog-to-digital converter 124a samples the beat frequency signals and converts the beat frequency signals into digital signals. The baseband radar signal processing module 126 is configured to convert the digital beat frequency signals from the time domain to the frequency domain using separate fast Fourier transforms for the up and down chirp signals. After fast Fourier transformation, the baseband radar signal processing module 126 finds the peaks in frequency, which correspond to target returns, utilizing a threshold value. The beat frequencies are then used to solve for target velocity v and range $R_0$, as previously described. The final result is a stream of measurements of range and target velocity (or range rate) for all targets present. In the example depicted in FIG. 7, the baseband radar signal processing module 126 is configured to compute and derive information about the radar target 102, such as range and range rate, and then store these radar measurements in a non-transitory tangible computer-readable storage medium 128.

The communications receiver of the combined radar/communications system 130 includes the reception antenna 116, the low-noise reception amplifier 118, a frequency mixer 120b (which is connected to a VCO 142 that applies a modulating signal of frequency $f_c(Rx)$ to the voltage control input from waveform generator 144, a low-pass filter 122b with a bandwidth B, an analog-to-digital converter 124b, and a baseband communications signal processing module 138 connected in series. The reception antenna 116 receives RF electromagnetic waves transmitted by the transmitter of the remote communications platform 132. The frequency mixer 120b frequency mixes the received signals output by the low-noise reception amplifier 118 with the signals having a carrier frequency $f_c(Rx)$ generated by the VCO 142 to produce second modulated signals containing phase information. The low-pass filter 122b performs low-pass filtering. The analog-to-digital converter 124a samples the filtered signals and converts those analog signals into digital signals. The baseband communications signal processing module 138 is configured to decode the digitals signals to extract the received communications data, which is then stored in a non-transitory tangible computer-readable storage medium 140.

As shown in FIG. 7, the baseband radar signal processing is only changed in a minor way to use the up and down chirped signals containing the communicated data. Basically, instead of processing up and down chirps with identical duration, the radar processing would process the received data by mixing with the transmitted non-uniform up and down chirps and doing the same calculations as in traditional FMCW processing. Fourier transforms together with Eqs. (1) and (2), which relate the beat frequency to range and range rate (or relative velocity), can be processed in the same manner as in typical FMCW radar. The controlling equations become $$f_{bu} = \frac{2R_0}{v_c} \cdot \frac{B}{T_i} + \frac{2f_c v}{v_c} \quad (7)$$

$$f_{bd} = -\frac{2R_0}{v_c} \cdot \frac{B}{2T - T_i} + \frac{2f_c v}{v_c} \quad (8)$$

when a symbol with slope dictated by $T_i$ is sent. From these equations, range $R_0$ and range rate v can be effectively estimated.

As described above, the basic FMCW system consists of a transmitter, a receiver and a mixer. A modulated signal is transmitted and received, and the transmitted and received signals are multiplied in the time domain and processed. More specifically, the process typically involves at least the following steps: (1) calculate the transmitted signal; (2) calculate the received signal; (3) mix the signals by multiplying in the time domain; (4) filter out one of the two derived sinusoidal terms; and (5) perform FFT on the filtered signal. FMCW processing is described in detail in many papers and books (see, e.g., Wu and Linnartz, "Detection Performance Improvement of FMCW Radar Using Frequency Shift", Symposium on Information Theory and Signal Processing in the Benelux, Brussels, Belgium, May 10-11, 2011 and Parrish, "An Overview of FMCW Systems in MATLAB") and is not further described herein.

Figure 12:
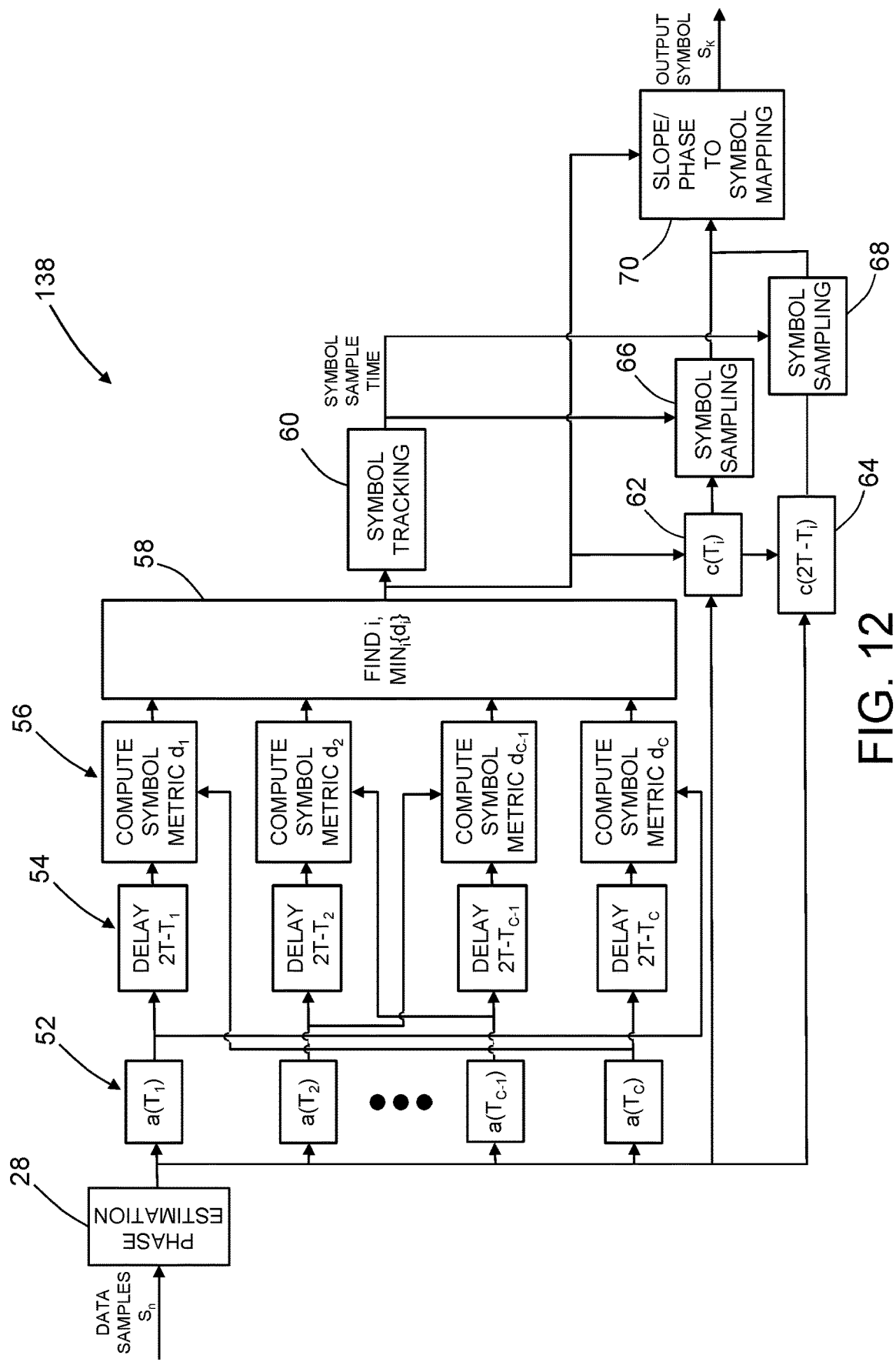
FIG. 12 is a flowchart identifying processing steps for baseband communications processing in accordance with one embodiment.

The processing of the waveform by the communications receiver (the uppermost processing path in FIG. 7) requires detecting each symbol received, which in the instant case means detecting the symbol frequency slopes and phases for both the first and second symbol chirps. This process is shown in FIG. 12. The process may use any method to compute estimates of chirp rate (a) and initial phase (c) (recall that the parameter b need not be estimated unless an estimate of Doppler frequency is desired), but a streaming method is preferable to reduce processing latency and storage. One such method is described in U.S. patent application Ser. No. 15/652,027. The method in its simple form takes as input a sampled form of a received signal and provides algorithms that do two things: (1) the method detects when linear phase-modulated signals are present using a calculated metric value (the metric is denoted by d in U.S. patent application Ser. No. 15/652,027; and (2) the method estimates three fixed parameters (see parameters a, b, c in Eq. (9) below) in the linear phase-modulated signal. The linear phase-modulated signal is described by the equation:

$$s(t) = e^{2\pi j (at^2 + bt + c)} \quad (9)$$

where t varies over time and a, b, c are parameters (hereinafter "coefficients") of a polynomial function that control the chirp slope (a.k.a. chirp rate), initial frequency and initial phase of the chirp signal. One can use parts of the methodology disclosed in U.S. patent application Ser. No. 15/652,027 to estimate the slope coefficient a and the phase coefficient c and in turn reliably detect the CRCW symbols being transmitted. The method of symbol detection for CRCW will be described in some detail below. However, there are other additional aspects to the design of a communications receiver which will not be described in detail because such details are well known to persons skilled in the art. This disclosure will focus on the reception and detection of the symbols being received in a CRCW receiver. The processing steps to estimate a and c are as follows.

Figure 8:
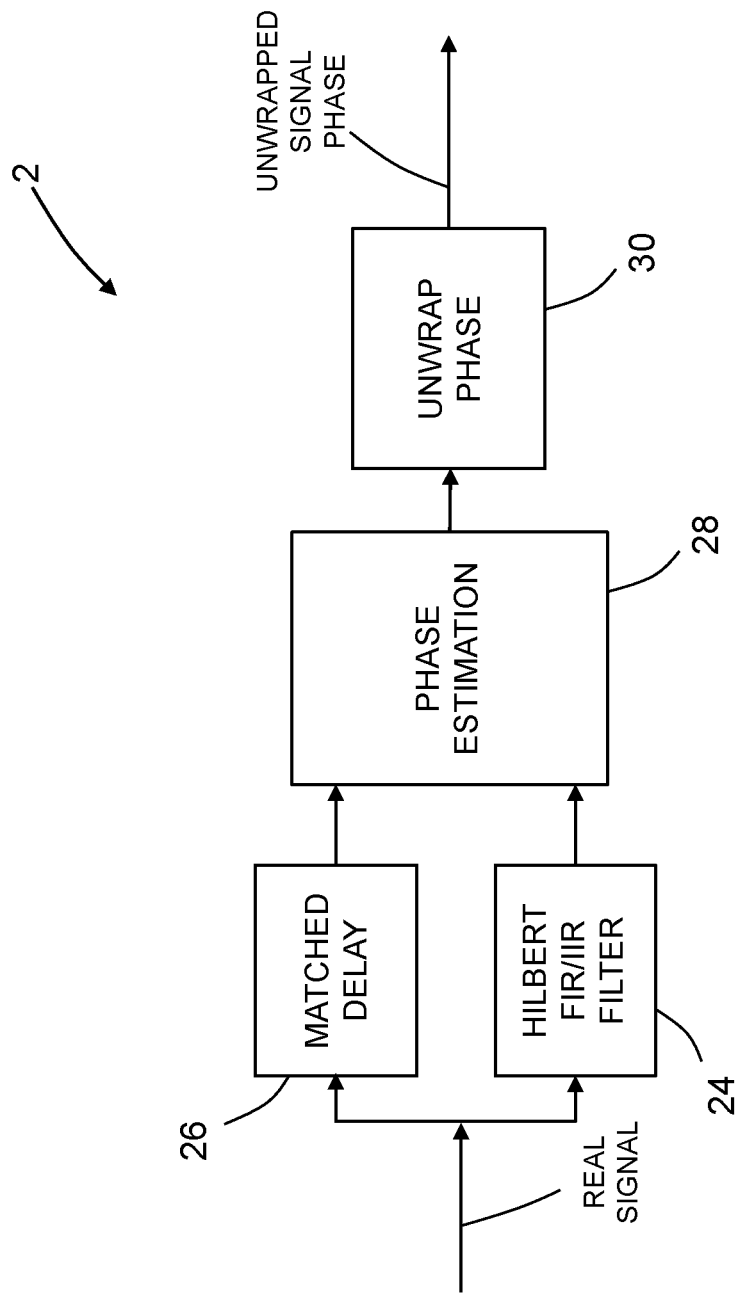
FIG. 8 is a block diagram identifying components of a subsystem for computing the unwrapped phase of a real signal.

First, a mixed and down-converted sampled data signal $\{s_n\}$ comes into the baseband communications signal processing module 138 identified in FIG. 7. Then a phase estimate is done. If the incoming digital signal is complex valued, the phase can be computed as a tan 2(im, re), where the complex signal sample is of the form (re+i(im)). The function a tan 2( ) is the arctangent function with two arguments. For any real number (e.g., floating point) arguments x and y not both equal to zero, a tan 2(y, x) is the angle in radians between the positive x-axis of a plane and the point given by the coordinates (x, y) on it. There are simplifications to calculating phase that are easier to implement in practice than a full calculation of the a tan 2( ) function. Alternate methods include: CORDIC (for COordinate Rotation Digital Computer, which is a simple and efficient algorithm to calculate hyperbolic and trigonometric functions, typically converging with one digit (or bit) per iteration), lookup tables and interpolation, and Chebyshev approximation. These are not further described herein since they are well known and standard. If, however, the incoming signal is real, the usual method to estimate phase involves using either a quadrature demodulator or a Hilbert filter before calculating the phase. The structure and function of a quadrature demodulator is well known. See, for example, U.S. Pat. Nos. 5,426,669, 6,191,649 and 6,310,513. There are also well-known different ways to form an analytic (complex) signal using a Hilbert filter. FIG. 8 shows one particular method 2 using a parallel delay and Hilbert filter approach before phase estimation. The final step (after phase estimation) is to unwrap the raw phase value.

Referring to FIG. 8, the incoming signal is real. An analytic signal is formed using a Hilbert filter 24 and a matched delay 26 arranged in parallel. The matched delay 26 provides a delay that matches the delay produced by the Hilbert filter 24. The delayed (real) and filtered (imaginary) signals are output in parallel to a phase estimator 28, which estimates the phases of the streaming signals. (Note that a normalized phase between −1 and 1 is used in what follows, rather than −π and π.) The signal phases output by phase estimator 28 are then unwrapped by a phase unwrapper 30. (As used herein, the verb "to unwrap" means to add 2π for each complete cycle of the sinusoidal signal.) Unwrapping of phase can be done in several different standard ways. A common and simple approach is to do the following: given a phase estimate θ and the previous phase sample $θ_0$, correct the phase estimate θ by adding multiples of ±2π (or ±1 if normalized) when $(θ−θ_0)$ is less than −π (normalized −1) (respectively greater than π (normalized +1)).

Next, for each slope length of $m=T_i$ for i=0, . . . , C−1, the following iteration computes an estimate for a and c at each time step n. Let $Sy_{-1}=0$ and $Sxy_{-1}=0$. Then iterating over the range in =0, . . . , C−1 using the following equations gives final estimates $\hat{a}_{c-1}$ and $\hat{c}_{c-1}$ for parameters a and c in Eq. (9):

$$Sy_n = Sy_{n-1} + θ_n - θ_{n-m}$$

$$Sxy_n = Sxy_{n-1} - Sy_{n-1} + mθ_n$$

$$\hat{a}_n = \hat{a}_{n-1} + A_1(m)(-2Sxy_{n-1} + Sy_{n-1} + mθ_n) + A_2(m)(-S_{n-1} + mθ_n) + A_3(m)(θ_n - θ_{n-m}) \quad (10)$$

$$\hat{c}_n = \hat{c}_{n-1} + C_1(m)(-2Sxy_{n-1} + Sy_{n-1} + mθ_n) + C_2(m)(-S_{n-1} + mθ_n) + C_3(m)(θ_n - θ_{n-m}) \quad (11)$$

Here the six values $A_1(m)$-$A_3(m)$ and $C_1(m)$-$C_3(m)$ are part of a 3×3 matrix M that is only dependent on the estimation window length $m=T_i$ and can be pre-computed for each chirp slope. The 3×3 matrix M is defined as follows:

$$M = \begin{bmatrix} \sum t_i^4 & \sum t_i^3 & \sum t_i^2 \\ \sum t_i^3 & \sum t_i^2 & \sum t_i \\ \sum t_i^2 & \sum t_i & 1 \end{bmatrix} = \begin{bmatrix} A_1(m) & A_2(m) & A_3(m) \\ \sum t_i^3 & \sum t_i^2 & \sum t_i \\ C_1(m) & C_2(m) & C_3(m) \end{bmatrix}$$

Here the sums are over M consecutive samples of the phase and it denotes the relative times of the M samples and can be defined as $t_i = i * f_s$. This approach comes from a direct application of ordinary least squares or linear regression.

Figure 9:
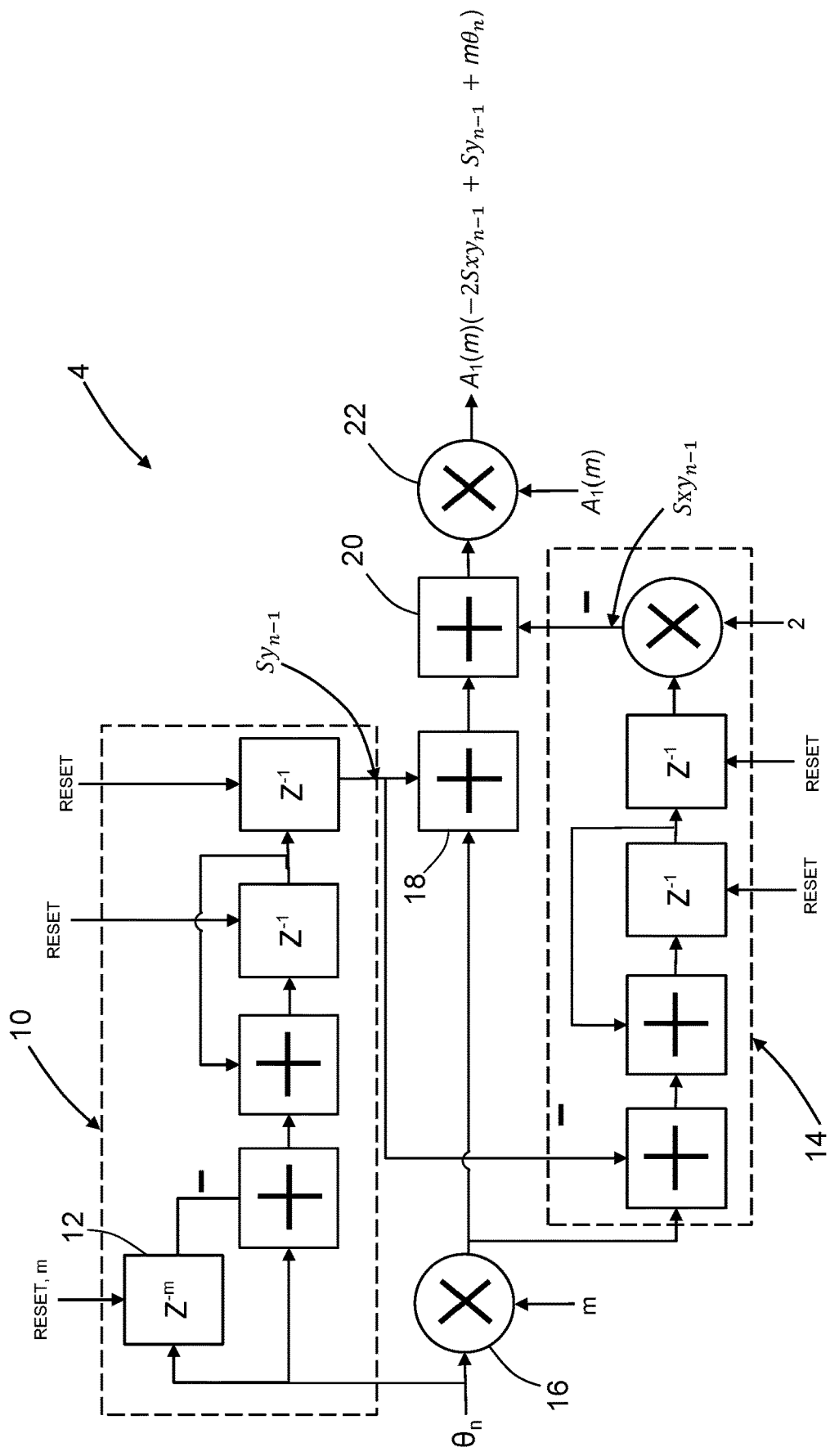
FIGS. 9-11 are diagrams symbolically representing electronic circuitry for respectively digitally computing the values of three terms in an equation for estimating a slope coefficient representing a chirp slope in accordance with one embodiment.
Figure 10:
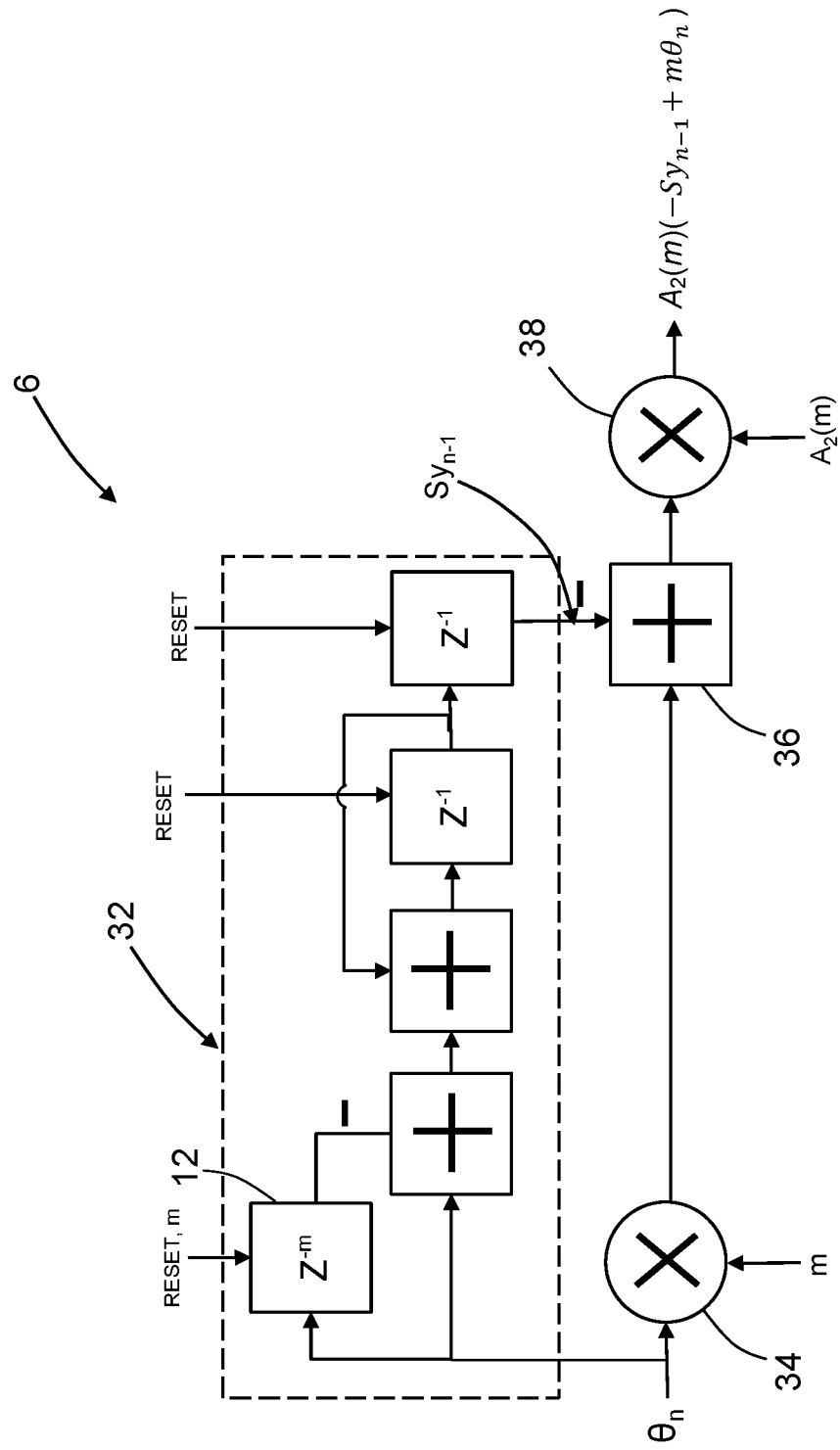
Figure 11:
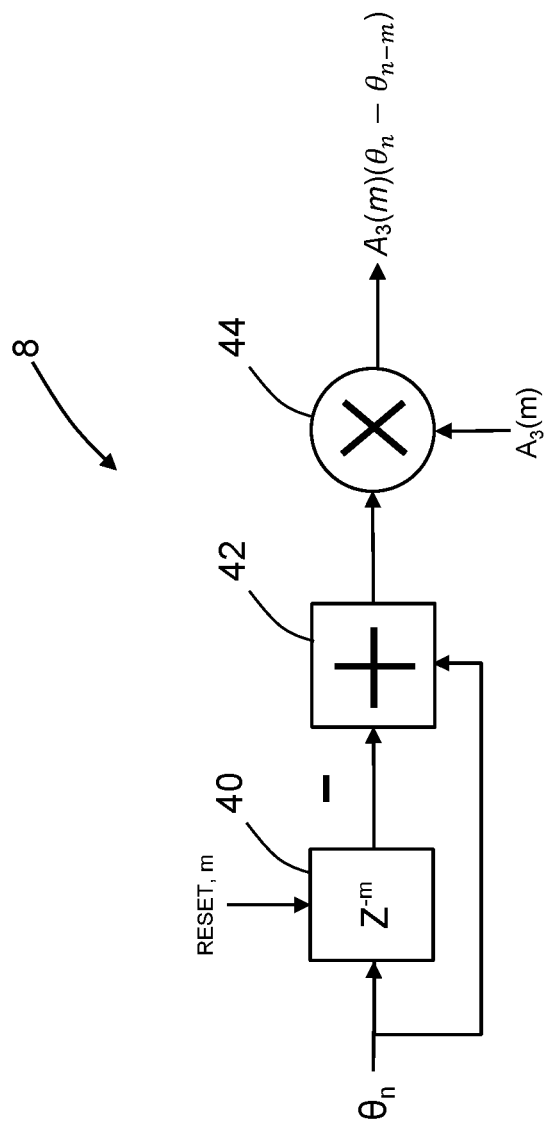

FIGS. 9-11 are diagrams symbolically representing electronic circuitry for respectively computing the values of three terms for estimating the chirp slope of the received signal (namely, the terms $A_1(m)(-2Sxy_{n-1}+Sy_{n-1}+mθ_n)$, $A_2(m)(-Sy_{n-1}+mθ_n)$ and $A_3(m)(θ_n-θ_{n-m})$ in Eq. (10)) implemented in a digital form that may be instantiated in a field-programmable gate array (FPGA) or an application-specific integrated circuit (ASIC).

FIG. 9 shows an implementation 4 of a method for estimating the first term $A_1(m)(-2Sxy_{n-1}+Sy_{n-1}+mθ_n)$ in Eq. (10). The notation used in FIG. 9 (and in FIGS. 10 and 11) is as follows: $Z^{-1}$ denotes a register or memory element which serves to delay a value by one clock period; the encircled "+" symbols denote a summer; and the encircled "x" symbols denote a multiplier. The phase estimate $0_n$ is inputted to a module 10 that estimates the value of parameter $Sy_{n-1}$. The module 10 includes a delay buffer 12 which can be programmed for different delay values (up to some implementation-dependent maximum) where the delay is set equal to the slope length m. The phase estimate $0_n$ is also inputted to multiplier 16, which outputs the term $mθ_n$ to a module 14 that estimates the value of parameter $-2Sxy_{n-1}$. The summer 18 adds the estimated values output by module 12 and multiplier 16 to form the sum $(Sy_{n-1}+mθ_n)$. The summer 20 then adds the estimated value output by module 14 to the sum output by summer 18 to form the sum $(-2Sxy_{n-1}+Sy_{n-1}+mθ_n)$. The multiplier 22 then multiplies the sum output by summer 20 and the value $A_1(m)$ to produce a value for the first term $A_1(m)(-2Sxy_{n-1}+Sy_{n-1}+mθ_n)$ in Eq. (10).

FIG. 10 shows an implementation 6 of a method for estimating the second term $A_2(m)(-Sy_{n-1}+mθ_n)$ in Eq. (10). The phase estimate $θ_n$ is inputted to a module 32 that estimates the value of parameter $Sy_{n-1}$. The phase estimate $0_n$ is also inputted to multiplier 34, which outputs the term $mθ_n$ to a summer 36. The summer 36 adds the estimated values output by module 32 and multiplier 34 to form the sum $(-Sy_{n-1}+mθ_n)$. The multiplier 38 then multiplies the sum output by summer 36 and the value $A_2(m)$ to produce a value for the second term $A_2(m)(-Sy_{n-1}+mθ_n)$ in Eq. (10).

FIG. 11 shows an implementation 8 of a method for estimating the third term $A_3(m)(\theta_n-\theta_{n-m})$ in Eq. (10). The phase estimate $\theta_n$ is inputted to a delay buffer 40 that delays the phase estimate by the slope length m. The phase estimate $\theta_n$ is also inputted to a summer 42 which adds the incoming phase estimate to the negative value of the delayed phase estimate output from delay buffer 40 to form the sum $(\theta_n-\theta_{n-m})$. The multiplier 44 then multiplies the sum output by summer 42 and the value $A_3(m)$ to produce a value for the third term $A_3(m)(\theta_n-\theta_{n-m})$ in Eq. (10).

FIG. 12 is a flowchart identifying steps of a method for baseband communications processing (performed by the baseband communications signal processing module 138 identified in FIG. 7) in accordance with one embodiment. The process partly depicted in FIG. 12 can generate parameter estimates using streaming (or on-the-fly) calculations and therefore is suitable for FPGA or ASIC or other hardware-based implementation. In the following description, the term "block" refers to an electronic circuit embodied in hardware. The baseband communications processing depicted in FIG. 12 works as follows.

Each of the slope coefficient estimation blocks 52 that do the calculations from Eq. (10) are labeled as $a(T_i)$ in FIG. 12 and similarly for the phase coefficient estimation block 62 labeled as $c(T_i)$ for Eq. (11). Only the references to $A_i(m)$ in the implementation figures (FIGS. 9-11) need to be changed to $C_i(m)$ to calculate $c(T_i)$.

Then a set of delay buffers 54, each of length $2T-T_i$, is used to line up the slope estimates for up and down chirps for each symbol i. Finally, symbol metric computation blocks 56 compute a symbol metric $d_i$ for each such symbol slope using the following equation:

$$d_i = \left(a_1 - \frac{B}{T_i}\right)^2 + \left(a_{C-i} - \frac{B}{2T-T_i}\right)^2$$

The smallest of the symbol metrics $d_i$ is then chosen in block 58 and that information is passed to both a symbol tracking block 60 and phase coefficient estimation blocks 62 and 64 which estimate phase coefficients c of each of the complementary chirps using Eq. (11). The symbol tracking block 60 identifies the time of the minimum value of the symbol metric of the chosen chirp slope and, using a standard symbol time filter, produces a symbol sample time signal that is used by respective symbol sampling blocks 66 and 68 to sample the phases computed from the phase coefficient estimation blocks 62 and 64. Lastly, the mapping block 70 takes the three identified values $\{a(T_i), c(T_i), c(2T-T_i)\}$ and from these values estimates the three indices of the received symbol by computing i, j and l as follows:

$$\left\{i = \left\langle\frac{\left(\frac{B}{a(T_i)} - T_{min}\right)}{(C-1)}\right\rangle, j = \left\langle\frac{D \cdot (c(T_i) + \pi)}{2\pi}\right\rangle, l = \left\langle\frac{D \cdot (c(2T - T_i) + \pi)}{2\pi}\right\rangle\right\}$$

This triple of integers defines the received symbol. Here the angled brackets denote rounding to the nearest integer.

Referring again to FIG. 7, the processing steps performed by the digital modulation symbol generator 136, which converts the communications data to symbols, will now be described in some detail. This processing block takes sequential sets of bits to be transmitted and converts them to digital values characterizing the symbols representing the communications data to be transmitted. It is very similar to how symbols get mapped to (I, Q) constellations before modulation. If the values of C and D are powers of 2, the main steps are as follows:

(1) Take a sequential set of K input bits, split the input bits into three sets of $\log_2 K_C$, $\log_2 K_D$ and $\log_2 K_D$ bits;

(2) Map the first set to a chirp slope of the first chirp of each symbol by interpreting the bits as a number i from 0 to C-1 and then compute $$T_i = T_{min} + (T_{max} - T_{min}) \cdot i/C;$$

(3) Map the second set to an initial phase of the first chirp of the symbol by interpreting the bits as a number j from 0 to D-1 and then compute $$\Theta_j = -\pi + 2\eta(j/D);$$

(4) Map the third set to an initial phase of the second chirp of the symbol by interpreting the bits as a number l from 0 to D-1 and then compute $$\Phi_l = -\pi + 2\pi(l/D).$$

These digital values are sent the combined radar/communications waveform generator 106' (see FIG. 7), which produces a modulating signal that is fed to the VCO 107 to produce a final RF chirped signal with the appropriate slope and phases. If the values of C and D are not powers of 2, this mapping can be accomplished through standard arithmetic coding techniques, where the bits to be sent are encoded in base $C \cdot D^2$ and then each digit $\delta$, $0 \leq \delta < C \cdot D^2$, is associated with the symbol time $T_i$ via $$T_i = T_{min} + (T_{max} - T_{min}) \cdot \lfloor \delta/D^2 \rfloor / C$$

where $\lfloor x \rfloor$ denotes the floor function, the greatest integer less than or equal to x.

The phases can then be found by setting $\delta_r = \text{rem}(\delta, D^2)$ (the remainder of dividing $\delta$ by $D^2$). Then $$\Theta_j = -\pi + 2\pi\lfloor \delta_r/D \rfloor/D$$

Similarly, set $\delta_s = \text{rem}(\delta_r, D)$ and $$\Phi_l = -\pi + 2\pi(\delta_s/D).$$

There are a number of variants of the waveform and architecture disclosed in detail above. For examples, this architecture could operate using a direct RF conversion architecture (see FIG. 7) where the analog-to-digital converter can be moved to directly after the low-noise amplifier. The processing that follows the analog-to-digital converter would then be digital instead of analog. This disclosure describes the case where each transmitter uses its own frequency. This prevents interference between two or more such systems. In alternative embodiments, such systems could also multiplex their outputs so that this does not happen. This could be controlled by a higher level protocol. Alternatively, the two systems could use the same frequency and through standard spread spectrum symbol coding, both could operate on the same frequency, but with greater mutual interference. The specific calculations described above with reference to FIG. 12 are based on uniformly spaced chirp times and phases. If this is not the case, the calculations would have to be modified via standard techniques.

A method has been described for combining radar and communications functions using a set of common hardware and common signal processing together with a common waveform family. Linear frequency-modulated symbols are used to send communications at the same time that the symbols are also used to measure range and range rate (or relative velocity) of signal reflections off of multiple targets (as a radar would do). In addition, radar detection and communications reception can be done in a streaming fashion, so as to avoid additional latency. Both range, range rate and symbol values are produced every symbol period T. Thus there is no need for synchronization intervals or periods of inactivity for either the radar or the communications system. This also means that the waveform is ideal for point and shoot networking applications where packets are short in time and data synchronization means inefficiency. The foregoing features provide benefits, including sharing of antennas for both systems when applicable, reducing cost associated with interference (primarily radio frequency interference) of two such systems on a single platform, and reducing cost and complexity so that upgrades of both systems can be accomplished at the same time and integration problems are taken care of in the design process.

Certain systems, apparatus, applications or processes have been described herein as including a number of modules. A module may be a unit of distinct functionality that may be implemented in software, hardware, or combinations thereof, except for those modules which are preferably implemented as hardware or firmware to enable streaming calculations as disclosed herein. When the functionality of a module is performed in any part through software, the module can include a non-transitory tangible computer-readable storage medium.

While systems and methods for performing combined radar and communications functions have been described with reference to various embodiments, it will be understood by those skilled in the art that various changes may be made and equivalents may be substituted for elements thereof without departing from the teachings herein. In addition, many modifications may be made to adapt the concepts and reductions to practice disclosed herein to a particular situation. Accordingly, it is intended that the subject matter covered by the claims not be limited to the disclosed embodiments.

The embodiments disclosed above use one or more processing or computing devices. Such devices typically include a processor, processing device, or controller, such as a general-purpose central processing unit, a microcontroller, a reduced instruction set computer processor, an ASIC, a programmable logic circuit, an FPGA, a digital signal processor, and/or any other circuit or processing device capable of executing the functions described herein. The methods described herein may be encoded as executable instructions embodied in a non-transitory tangible computer-readable storage medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the terms "processor" and "computing device".

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A combined radar/communications system comprising a common radar/communications transmitter having a transmission antenna and a combined radar and communications receiver having a common reception antenna, wherein the common radar/communications transmitter is configured to transmit combined radar/communications waveform-modulated signals having a first center frequency and comprising symbols, each symbol consisting of an up chirp and a down chirp, and the combined radar and communications receiver comprises:
   a first mixer that mixes received signals from the reception antenna with the transmitted signals and outputs first demodulated signals;
   a baseband radar signal processing module configured to estimate range and range rate of a radar object based on beat frequencies derived from the first demodulated signals;
   a second mixer that mixes received signals from the reception antenna with a frequency-modulated signal having a second center frequency of a transmitting communications platform located at a distance from the common reception antenna and outputs second demodulated signals; and
   a baseband communications signal processing module configured to detect slopes and initial phases of the up and down chirps of each symbol in the second demodulated signals,
   wherein the first and second center frequencies are different.

2. The system as recited in claim 1, wherein the up and down chirps of successive symbols have non-uniform slopes.

3. The system as recited in claim 1, wherein the up and down chirps of successive symbols have non-uniform initial phases.

4. The system as recited in claim 1, wherein the baseband communications signal processing module comprises:
   a phase estimator comprising hardware or firmware configured to estimate a respective instantaneous signal phase of the received signal for each signal sample; and
   a slope coefficient estimator connected to the phase estimator and comprising hardware or firmware configured to estimate a slope coefficient for each symbol of the received signal.

5. The system as recited in claim 4, wherein the slope coefficient estimator is a field-programmable gate array or an application-specific integrated circuit.

6. The system as recited in claim 4, wherein the baseband communications signal processing module further comprises a pair of phase coefficient estimators configured to estimate a respective phase coefficient for each of the up and down chirps for each symbol in the received signal.

7. The system as recited in claim 6, wherein the baseband communications signal processing module further comprises a slope/phase-to-symbol mapping module configured to compute three indices identifying each symbol based on the estimated slope coefficient and the pair of estimated phase coefficients.

8. The system as recited in claim 1, wherein the common radar/communications transmitter further comprises the following components connected in series:
   a communications data source that stores data to be transmitted;
   a digital modulation symbol generator that converts the communications data to symbols;

a digital-to-analog converter that converts the digital symbols to analog symbols;

a combined radar/communications waveform generator that converts the analog symbols received from the digital-to-analog converter into oscillator control voltages;

a voltage-controlled oscillator that applies a modulating signal to a carrier signal having a transmit frequency based on the voltage control inputs and outputs combined radar/communications waveform-modulated signals; and a transmission amplifier that amplifies the resulting combined radar/communications waveform-modulated signals, wherein the transmission antenna broadcasts the combined radar/communications waveform-modulated signals.

9. The system as recited in claim 8, wherein the digital modulation symbol generator is configured to convert bits representing communications data to be transmitted into digital values characterizing symbols to be transmitted.

10. The system as recited in claim 9, wherein the digital values are a slope of a first chirp of a symbol, an initial phase of the first chirp of the symbol and an initial phase of the second chirp of the symbol.

11. A combined radar and communications receiver comprising:
a reception antenna;
a first mixer that mixes received signals from the reception antenna with transmitted signals having a first center frequency transmitted by a first transmitter and outputs first demodulated signals;
a baseband radar signal processing module configured to estimate range and range rate of a radar object based on beat frequencies derived from the first demodulated signals;
a second mixer that mixes received signals from the reception antenna with a frequency-modulated signal having a second center frequency of a second transmitter and outputs second demodulated signals; and
a baseband communications signal processing module configured to detect slopes and initial phases of up and down chirps of each symbol in the second demodulated signals,
wherein the first and second center frequencies are different.

12. The receiver as recited in claim 11, wherein the baseband communications signal processing module comprises:
a phase estimator comprising hardware or firmware configured to estimate a respective instantaneous signal phase of the received signal for each signal sample; and
a slope coefficient estimator connected to the phase estimator and comprising hardware or firmware configured to estimate a slope coefficient for each symbol of the received signal.

13. The receiver as recited in claim 12, wherein the slope coefficient estimator is a field-programmable gate array or an application-specific integrated circuit.

14. The receiver as recited in claim 12, wherein the baseband communications signal processing module further comprises a pair of phase coefficient estimators configured to estimate a respective phase coefficient for each of the up and down chirps for each symbol in the received signal.

15. The receiver as recited in claim 14, wherein the baseband communications signal processing module further comprises a slope/phase-to-symbol mapping module configured to compute three indices identifying each symbol based on the estimated slope coefficient and the pair of estimated phase coefficients.

16. A method for operating a combined radar/communications system, comprising:
transmitting combined radar/communications waveform-modulated signals having a first center frequency and comprising symbols using a transmission antenna, each symbol consisting of an up chirp and a down chirp;
receiving at a reception antenna portions of the combined radar/communications waveform-modulated signals returned from a radar target;
mixing received signals from the reception antenna with the transmitted signals to produce first demodulated signals;
deriving beat frequencies from the first demodulated signals;
estimating range and range rate of a radar object based on the beat frequencies;
mixing received signals from the reception antenna with a frequency-modulated signal having a second center frequency of a transmitting communications platform located at a distance from the common reception antenna to produce second demodulated signals; and
detecting slopes and initial phases of the up and down chirps of each symbol in the second demodulated signals,
wherein the first and second center frequencies are different.

17. The method as recited in claim 16, wherein the up and down chirps of successive symbols have non-uniform slopes.

18. The method as recited in claim 16, wherein the up and down chirps of successive symbols have non-uniform initial phases.

19. The method as recited in claim 16, wherein detecting slopes and initial phases comprises:
estimating a respective instantaneous signal phase of the received signal for each signal sample;
estimating a slope coefficient for each symbol of the received signal; and
estimating a respective phase coefficient for each of the up and down chirps for each symbol in the received signal.

20. The method as recited in claim 19, further comprising computing three indices identifying each symbol based on the estimated slope coefficient and the pair of estimated phase coefficients.

* * * * *